(12) United States Patent
Shin et al.

(10) Patent No.: US 9,431,255 B2
(45) Date of Patent: Aug. 30, 2016

(54) METHOD FOR ETCHING HIGH-K METAL GATE STACK

(71) Applicant: SK hynix Inc., Gyeonggi-do (KR)

(72) Inventors: Su-Bum Shin, Gyeonggi-do (KR); Hae-Jung Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/738,343

(22) Filed: Jun. 12, 2015

(65) Prior Publication Data

US 2016/0181107 A1 Jun. 23, 2016

(30) Foreign Application Priority Data

Dec. 19, 2014 (KR) .................. 10-2014-0184983

(51) Int. Cl.
| | |
|---|---|
| *H01L 21/3205* | (2006.01) |
| *H01L 21/4763* | (2006.01) |
| *H01L 21/28* | (2006.01) |
| *H01L 29/40* | (2006.01) |
| *H01L 21/311* | (2006.01) |
| *H01L 21/02* | (2006.01) |
| *H01L 29/49* | (2006.01) |

(52) U.S. Cl.
CPC ..... *H01L 21/28132* (2013.01); *H01L 21/0206* (2013.01); *H01L 21/28088* (2013.01); *H01L 21/31116* (2013.01); *H01L 29/401* (2013.01); *H01L 29/4966* (2013.01); *H01L 21/31122* (2013.01)

(58) Field of Classification Search
None
See application file for complete search history.

(56) References Cited

U.S. PATENT DOCUMENTS

| | | | |
|---|---|---|---|
| 7,361,561 B2 | 4/2008 | Goolsby et al. | |
| 8,466,023 B2 | 6/2013 | Chang et al. | |
| 2005/0081781 A1* | 4/2005 | Lin | H01L 21/28079 117/104 |
| 2012/0244693 A1 | 9/2012 | Luong et al. | |

* cited by examiner

*Primary Examiner* — Angel Roman
(74) *Attorney, Agent, or Firm* — IP & T Group LLP

(57) ABSTRACT

A method for etching a gate includes forming a high-k material layer over a substrate; forming an overlying layer over the high-k material layer; performing a first etching process for etching the overlying layer to form an overlying layer pattern; forming a spacer on a sidewall of the overlying layer pattern; and performing a second etching process using plasma including a etch gas and an additive gas, to etch the high-k material layer, wherein an amount of the additive gas is substantially the same as the main etch gas to increase an etch selectivity with respect to the substrate.

19 Claims, 22 Drawing Sheets

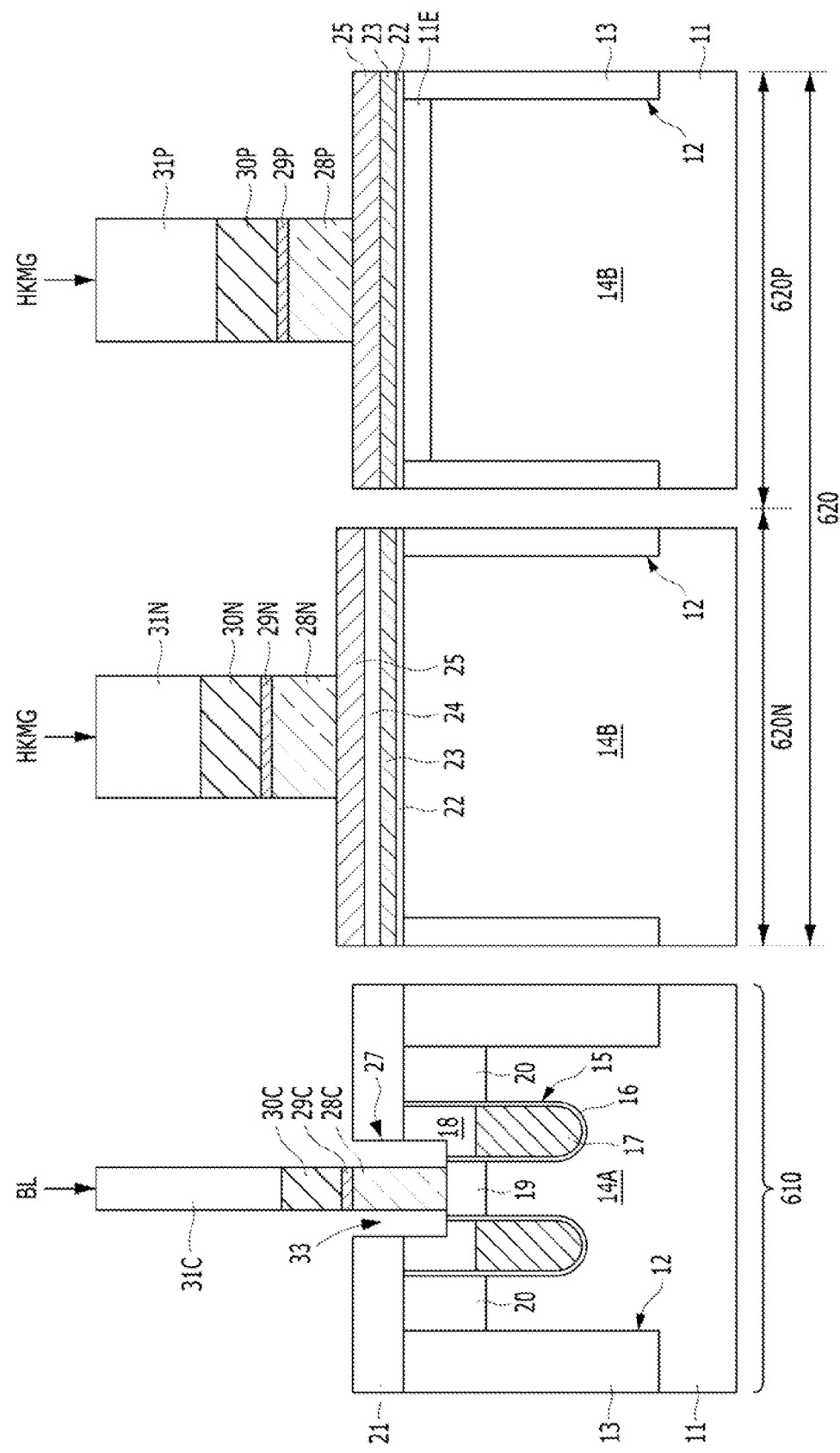

METHOD FOR ETCHING HIGH-K METAL GATE STACK

CROSS-REFERENCE TO RELATED APPLICATION

This application claims priority under 35 U.S.C. §119 to Korean Patent Application No. 10-2014-0184983 filed on Dec. 19, 2014, the disclosure of which is herein incorporated by reference in its entirety.

TECHNICAL FIELD

Exemplary embodiments of the present invention relate to a method for manufacturing a semiconductor device, and more particularly, to a method for etching a high-k metal gate stack.

DISCUSSION OF THE RELATED ART

A gate structure includes a gate electrode which is positioned on a gate dielectric layer. In general, a gate dielectric layer is formed of silicon oxide, and a gate electrode is formed of polysilicon.

A high-k dielectric material and a metal gate electrode are used to improve device performance when a device is down-scaled. The high-k dielectric material refers to a material which has a dielectric constant higher than the dielectric constant of silicon oxide. For example, the high-k dielectric material may have a dielectric constant higher than 3.9. Hereafter, the high-k dielectric material will be referred to as a "high-k material".

A gate structure including a high-k material and a metal gate electrode is referred to as a "high-k metal gate structure".

Fabricating a high-k metal gate structure may include a gate stack forming process and a gate stack etching process. The gate stack forming process is a process for forming a multi-layer structure including a high-k material and a metal-containing layer. The multi-layer structure including a high-k material and a metal-containing layer may be referred to as a "high-k metal gate stack". The gate stack etching process is a process for etching the high-k metal gate stack, that is, a process for patterning a high-k metal gate structure.

In the process for etching the high-k metal gate stack, it is difficult to etch a high-k material using the etchants generally known in the art. In addition, during a process for etching the high-k material, the high-k material is likely to be damaged by plasma, or other materials may be damaged due to a low etch selectivity between the high-k material and the other materials. For example, substrate recessing or undercutting may be caused due to a low etch selectivity.

SUMMARY

Various embodiments are directed to a method for etching a gate stack, capable of having a high etch selectivity with respect to the other materials during an etching process for a high-k material.

Also, various embodiments are directed to a method for manufacturing a semiconductor device, capable of simultaneously etching stacks positioned the same in different regions, without an etching defect.

In an embodiment, a method for a gate may include: forming a high-k material layer over a substrate; forming an overlying layer over the high-k material layer; performing a first etching process for etching the overlying layer to form an overlying layer pattern; forming a spacer on a sidewall of the overlying layer pattern; and performing a second etching process using plasma including a etch gas and an additive gas, to etch the high-k material layer, wherein an amount of the additive gas is substantially the same as the main etch gas to increase an etch selectivity with respect to the substrate. The second etching process is performed at a temperature higher than the first etching process. The main etch gas includes $BCl_3$. The additive gas includes argon. The high-k material layer includes a hafnium-containing layer. The first etching process and the second etching process are performed in inductively coupled plasma equipment. The second etching process is performed by applying bias power larger than 10 W. The method may further include: performing hydrogen fluoride (HF)-based wet cleaning after the second etching process. The first etching process is performed at 50 degrees Celsius, and wherein the second etching process is performed at 220 degrees Celsius. The overlying layer includes a work function adjustment layer, a silicon-based capping layer over the work function adjustment layer, and a metal gate electrode layer over the silicon-based capping layer. The first etching process includes: a first sub etching process for etching the silicon-based capping layer; and a second sub etching process for etching the work function adjustment layer. The first sub etching process includes a main etching process and an over etching process, and wherein the over etching process is performed using an etchant which has a selectivity equal to or higher than 10 with respect to the work function adjustment layer. The over etching process is performed using plasma including a bromine-containing gas and an oxygen-containing gas. The second sub etching process is performed using plasma including a chlorine-containing gas and argon gas. The overlying layer includes a rare earth metal-based capping layer, a work function adjustment layer over the rare earth metal-based capping layer, a silicon-based capping layer over the work function adjustment layer, and a metal gate electrode layer over the silicon-based capping layer. The first etching process includes: a first sub etching process for etching the silicon-based capping layer; a second sub etching process for etching the work function adjustment layer; and a third sub etching process for etching the rare earth metal-based capping layer. The first sub etching process includes (i) a main etching process which is performed until the work function adjustment layer is exposed and (ii) an over etching process which is performed after the work function adjustment layer is exposed, and wherein the over etching process is performed using plasma which has a selectivity equal to or higher than 10 with respect to the work function adjustment layer. The over etching process is performed using plasma including a bromine-containing gas and oxygen gas. The second sub etching process is performed using plasma including a chlorine-containing gas and argon gas. The third sub etching process is performed using plasma including HCl.

In an embodiment, a method for manufacturing a semiconductor device may include: preparing a substrate including a first region and a second region; stacking an underlying layer and a high-k material layer over the substrate in the first region; forming an overlying layer over the high-k material layer and the substrate in the second region; and performing an etching process for etching the overlying layer, the high-k material layer, and the underlying layer to simultaneously form a gate structure in the first region and a bit line structure in the second region, wherein the performing of the etching process comprising: performing a first etching process for etching the overlying layer; and performing a second etching process using plasma including a chlorine-containing gas and an additive gas to etch the high-k material layer, and wherein the second etching process is performed at a temperature higher than the first etching process. An amount of the additive gas included in the plasma is substantially the same as the chlorine-containing gas included in the plasma. The chlorine-containing gas includes $BCl_3$. The additive gas includes argon. The high-k material layer includes a hafnium-containing layer. The first etching process and the second etching process are performed in inductively coupled plasma equipment, wherein both source power and bias power of the inductively coupled plasma equipment are applied at a frequency of 13.56 MHz. The second etching process is performed by applying bias power higher than 15 W and lower than 25 W. The method may further include: performing hydrogen fluoride (HF)-based wet cleaning after the second etching process. The first etching process is performed at 50 degrees Celsius, and wherein the second etching process is performed at 220 degrees Celsius. The overlying layer includes titanium nitride and polysilicon over the titanium nitride. The first etching process includes: a first sub etching process for etching the polysilicon; and a second sub etching process for etching the titanium nitride. The first sub etching process includes (i) a main etching process which is performed until the titanium nitride is exposed and (ii) an over etching process which is performed even after the titanium nitride is exposed, and wherein the over etching process is performed using an etchant which has a selectivity equal to or higher than 10 with respect to the titanium nitride. The over etching process is performed using plasma in which HBr and $O_2$ are mixed. The second sub etching process is performed using plasma which includes $Cl_2$ and Ar gas. The overlying layer includes lanthanum oxide, titanium nitride over the lanthanum oxide, and polysilicon over the titanium nitride. The first etching process includes: a first sub etching process for etching the polysilicon; a second sub etching process for etching the titanium nitride; and a third sub etching process for etching the lanthanum oxide. The first sub etching process includes a main etching process which is performed until the titanium nitride is exposed and an over etching process which is performed after the titanium nitride is exposed, and wherein the over etching process is performed using plasma which has a selectivity equal to or higher than 10 with respect to the titanium nitride. The over etching process is performed using plasma including HBr and $O_2$. The second sub etching process is performed using plasma including $Cl_2$ and Ar gas. The third sub etching process is performed using plasma including HCl.

BRIEF DESCRIPTION OF THE DRAWINGS

FIGS. 10A to 10I are cross-sectional views illustrating a method for manufacturing a memory device according to an embodiment.

DETAILED DESCRIPTION

Figure 1:
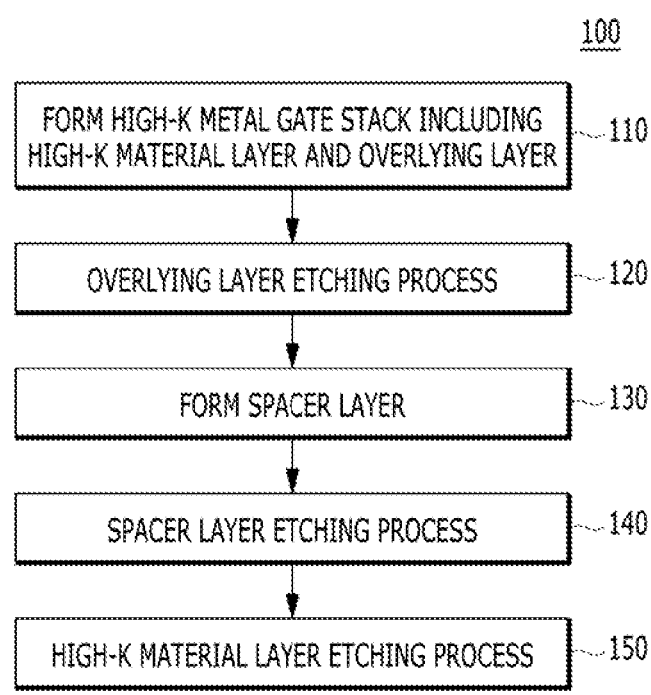
FIG. 1 is a flow chart describing a method for manufacturing a high-k metal gate structure in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An embodiment discloses an etching process for a high-k metal gate stack including a high-k material and a metal layer. The high-k metal gate stack may include a high-k material and other materials. The other materials may include an overlying material (OL) positioned over the high-k material, and an underlying material (UL) positioned under the high-k material. The underlying material and the overlying material may be a single layer or a multi-layer.

An embodiment discloses an etching process capable of simultaneously etching different stacks respectively positioned in different regions without causing an etching defect.

FIG. 1 is a flow chart describing a method for manufacturing a high-k metal gate structure in accordance with a first embodiment. FIG. 1 shows a process 100 performed for a high-k metal gate stack. The process 100 may include a plurality of processes performed against the high-k metal gate stack.

FIGS. 2A to 2E are cross-sectional views describing a method for manufacturing the high-k metal gate structure in accordance with the first embodiment. The process 100 in accordance with the first embodiment may include a first process 110, a second process 120, a third process 130, a fourth process 140, and a fifth process 150. The first process 110 and the third process 130 may be deposition processes, and the second process 120, the fourth process 140 and the fifth process 150 may be etching processes.

Figure 2A:
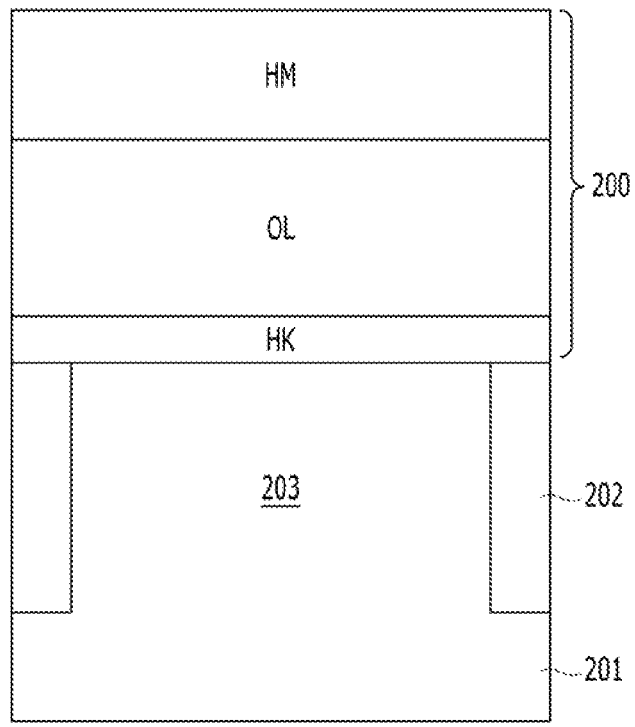
FIGS. 2A to 2E are cross-sectional views describing a method for manufacturing the high-k metal gate structure in accordance with the first embodiment.
Figure 2B:
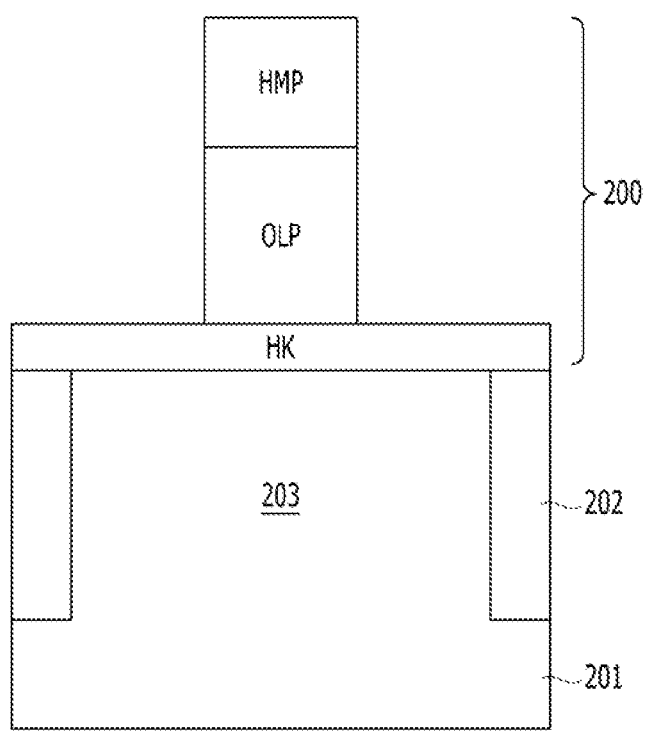

In the first process 110, a high-k metal gate stack 200 may be formed on a substrate 201 (see FIG. 2A). The substrate 201 may include a semiconductor substrate. The substrate 201 may be formed of a silicon-containing material. The substrate 201 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. Also, the substrate 201 may include another semiconductor material such as germanium. Moreover, the substrate 201 may include a III/V group semiconductor, for example, a compound semiconductor substrate such as GaAs. Further, the substrate 201 may include a silicon-on-insulator (SOI) substrate.

Isolation regions 202 and an active region 203 may be formed in the substrate 201. The active region 203 may be defined by the isolation regions 202. The isolation regions 202 may be STI (shallow trench isolation) regions which are formed by trench etching. Chemical vapor deposition (CVD) or another deposition process may be used to fill trenches with a dielectric material. A planarization process such as chemical-mechanical polishing (CMP) may be additionally used.

The high-k metal gate stack 200 may be a layered structure of various different layers. The high-k metal gate stack 200 may include a high-k material layer HK and other material layers. For example, the high-k metal gate stack 200 may include the high-k material layer HK, an overlying layer OL, and a hard mask layer HM. The high-k material layer HK may be formed on the substrate 201, and the overlying layer OL may be formed on the high-k material layer HK. The overlying layer OL may be a single layer or a multi-layer. The hard mask layer HM may be formed on the overlying layer OL.

In another embodiment, a high-k metal gate stack 200 may include an underlying layer UL, a high-k material layer HK, an overlying layer OL, and a hard mask layer HM. The underlying layer UL may be formed on the substrate 201, and the high-k material layer HK may be formed on the underlying layer UL. The overlying layer OL may be formed on the high-k material layer HK. The underlying layer UL may include a dielectric material. The underlying layer UL may include a material which has a dielectric constant lower than the high-k material layer HK. The underlying layer UL may include silicon oxide, silicon oxynitride or a combination thereof. In some embodiments, the underlying layer UL may be referred to as an interface layer IL. The underlying layer UL may be formed by thermal oxidation before or after forming the high-k material layer HK. Also, the underlying layer UL may be a chemical oxide formed by a chemical cleaning composition applied to the substrate 201.

The high-k material layer HK may include a material which has a dielectric constant higher than the dielectric constant of silicon oxide. For example, the high-k material layer HK may include a material which has a dielectric constant higher than 3.9. For another example, the high-k material layer HK may include a material which has a dielectric constant higher than 10. For still another example, the high-k material layer HK may include a material which has a dielectric constant of 10 to 30. The high-k material layer HK may include at least one metallic element.

A high-k material appropriate for the high-k material layer HK may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be used.

The overlying layer OL may include a conductive material. The overlying layer OL may include a metal or a metal-containing layer. Also, the overlying layer OL may include a combination of a metal-containing layer and a silicon-containing layer. For example, the overlying layer OL may include a titanium nitride (TiN), tungsten (W), polysilicon or a combination thereof. The metal-containing layer included in the overlying layer OL may be referred to as a "metal gate electrode layer". The metal gate electrode layer may include a low resistivity metal such as tungsten and aluminum (Al).

The hard mask layer HM may be formed on the overlying layer OL. The hard mask layer HM may be used as an etch mask while etching the overlying layer OL and the high-k material layer HK. The hard mask layer HM may include a material which has an etch selectivity with respect to the overlying layer OL and the high-k material layer HK. The hard mask layer HM may be formed of silicon nitride.

In general, the high-k material layer HK, the overlying layer OL and the hard mask layer HM may be formed using a deposition process such as chemical vapor deposition (CVD). The chemical vapor deposition (CVD) may include atmospheric pressure chemical vapor deposition (APCVD), low pressure chemical vapor deposition (LPCVD), plasma-enhanced chemical vapor deposition (PECVD) or metal organic chemical vapor deposition (MOCVD). In another embodiment, the high-k material layer HK and the overlying layer OL may be formed using physical vapor deposition (PVD). In still another embodiment, the high-k material layer HK and the overlying layer OL may be formed using atomic layer deposition (ALD).

The above-described structure in which the overlying layer OL including a metal-containing layer is positioned on the high-k material layer HK is referred to as the high-k metal gate stack 200. In the second process 120, the high-k metal gate stack 200 may be partially etched. The second process 120 includes an etching process for etching the overlying layer OL, and accordingly, an overlying layer pattern OLP may be formed (see FIG. 2B).

Before etching the overlying layer OL, an etching process for the hard mask layer HM may be performed. A hard mask layer pattern HMP may be formed. While not shown, the hard mask layer HM may be etched using a photoresist pattern as an etch mask. The photoresist pattern may be formed by a photolithography process generally known in the art. After removing the photoresist pattern, the overlying layer OL may be etched using the hard mask layer pattern HMP as an etch mask.

The second process 120 may be performed in a plasma etch reactor. For example, the second process 120 may be performed in an inductively coupled plasma reactor. The inductively coupled plasma reactor uses radio frequency (RF) source power to excite plasma in a vacuum chamber. In the inductively coupled plasma reactor, RF source power is inductively coupled to a process chamber. The inductively coupled plasma reactor may have an additional radio frequency (RF) generator located close to a substrate. The additional RF generator is referred to as a bias radio frequency (RF) generator. RF bias power is generated by the bias RF generator. In the inductively coupled plasma reactor, the frequency for both source power and bias power may be set to 13.56 MHz.

The etching process for the overlying layer OL may have a high etch selectivity between the overlying layer OL and the high-k material layer HK. That is, the overlying layer OL is etched more rapidly than the high-k material layer HK. In the case where the overlying layer OL is a multi-layer, the second process 120 may include a plurality of sub processes.

Figure 2C:
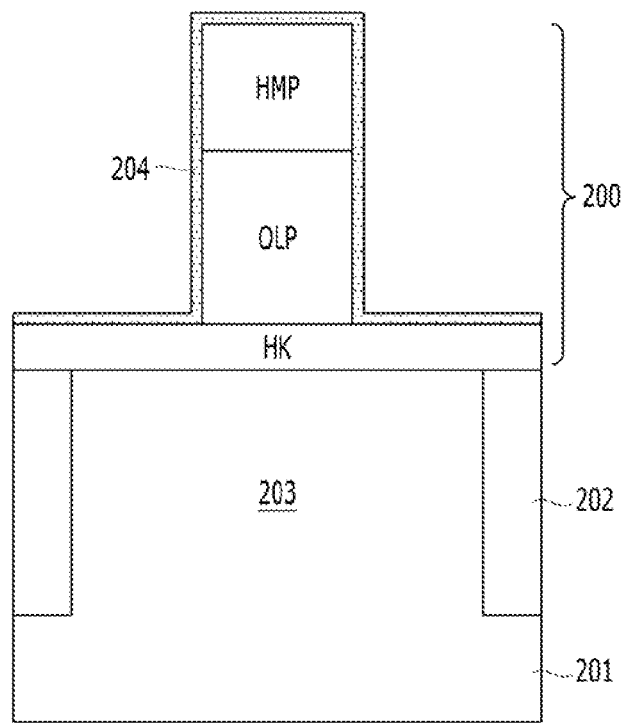
Figure 2D:
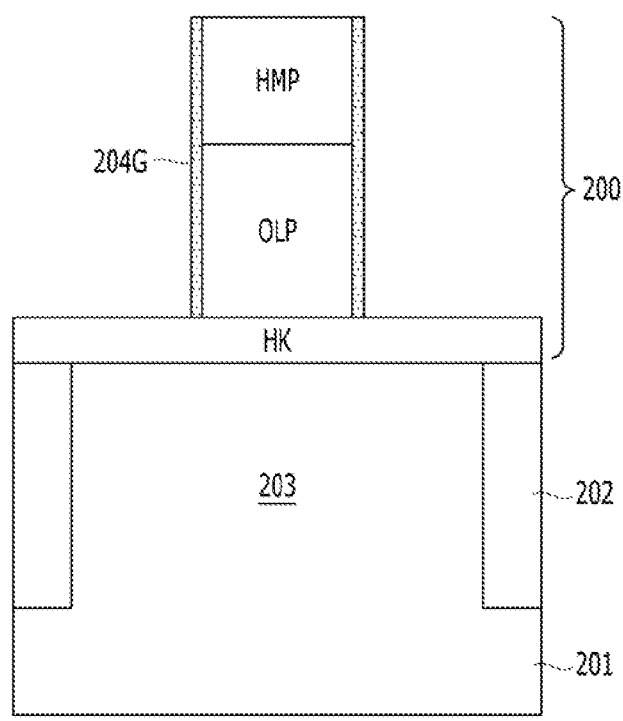
Figure 2E:
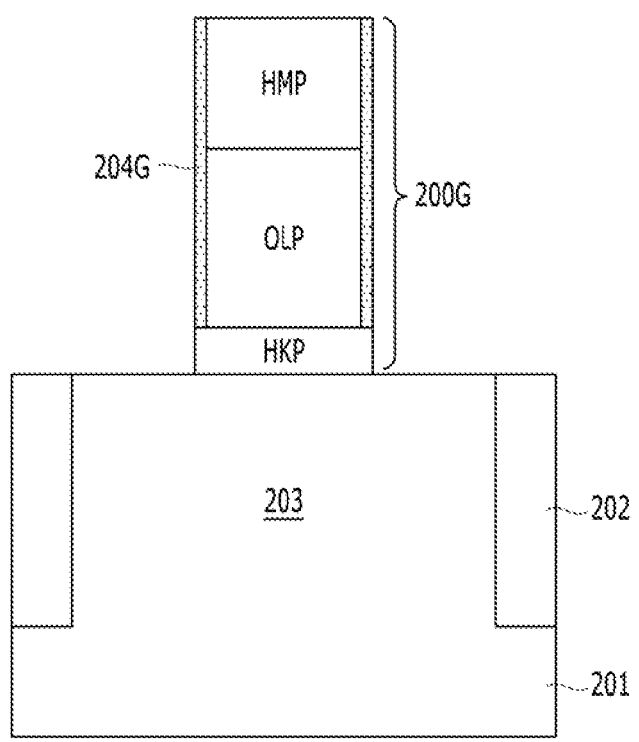

In the third process 130, a spacer layer 204 may be formed (see FIG. 2C). The spacer layer 204 may include a dielectric material. The spacer layer 204 may be formed of a material having an etch selectivity with respect to the high-k material layer HK. The spacer layer 204 may be formed of the same material as the hard mask layer pattern HMP. For example, the spacer layer 204 may include silicon nitride.

In the fourth process 140, the spacer layer 204 may be etched. By an etching process for the spacer layer 204, spacers 204G may be formed (see FIG. 2D). The spacers 204G may be formed on the sidewalls of the overlying layer pattern OLP and the hard mask layer pattern HMP. The etching process for the spacer layer 204 may be performed in a plasma etch reactor.

In the fifth process 150, the high-k material layer HK may be etched. By using the spacers 204 and the hard mask layer pattern HMP as an etch mask, the high-k material layer HK may be etched. A high-k material layer pattern HKP may be formed (see FIG. 2E). The fifth process 150 may be performed in a plasma etch reactor in the same manner as the second process 120. For example, the fifth process 150 may be performed in an inductively coupled plasma (ICP) reactor.

An etching process for the high-k material layer HK may have a high etch selectivity between the high-k material layer HK and another material, that is, the substrate 201.

The etching process for etching the high-k material layer HK is as follows. To prevent pitting and excessive substrate recessing due to a low etch selectivity between the high-k material layer HK and the substrate 201, the etching process may be performed by controlling bias power and source power. In particular, to prevent the production of etching residues and excessive substrate recessing, bias power may be selected in the range of 15 W to 25 W.

As an etchant, plasma including a main etch gas and an additive gas may be used. The main etch gas serves to etch the high-k material layer HK. The additive gas increases an etch selectivity between the high-k material layer HK and the substrate 201. The main etch gas may include at least one species. One of species may include chlorine. The main etch gas may include a chlorine-containing gas. The main etch gas may include boron and chlorine. In an embodiment, the main etch gas may include $BCl_3$. The additive gas may include argon (Ar). To prevent excessive recessing of the substrate 201, the amount of the additive gas may be the same as the amount of the main etch gas. Thus, an etch selectivity between the high-k material layer HK and the substrate 201 may be increased.

To increase volatility of an etch byproduct containing the species of the main etch gas, the etching process may be performed at a high temperature. The etching process for the high-k material layer HK may be performed at a higher temperature than the etching process for the overlying layer OL. The etching process for the overlying layer OL may be performed in a low temperature chamber, and the etching process for the high-k material layer HK may be performed in a high temperature chamber. For example, the etching process for the overlying layer OL may be performed in a chamber at a 50 degrees Celsius. The etching process for the high-k material layer HK may be performed in a chamber at a 220 degrees Celsius. As the etching process for the high-k material layer HK is performed at a high temperature, volatility of an etch byproduct may be increased. As the volatility of an etch byproduct increases, the amount of a nonvolatile etch byproduct may be decreased. As a consequence, when the etching process for the high-k material layer HK is performed at a high temperature, it is possible to prevent re-deposition of the nonvolatile etch byproduct on sidewalls of the high-k material layer pattern HKP.

The fifth process 150 may further include a wet cleaning process. For example, after the etching process for the high-k material layer HK, the wet cleaning process may be performed so that residues may be cleanly removed. The wet cleaning process may be performed using a hydrogen fluoride (HF)-based solution.

By the process 100 as described above, a high-k metal gate structure 200G may be formed on the substrate 201. The high-k metal gate structure 200G may include the high-k material layer pattern HKP, the overlying layer pattern OLP, and the hard mask layer pattern HMP. In a subsequent process, the hard mask layer pattern HMP may be removed.

Figure 3:
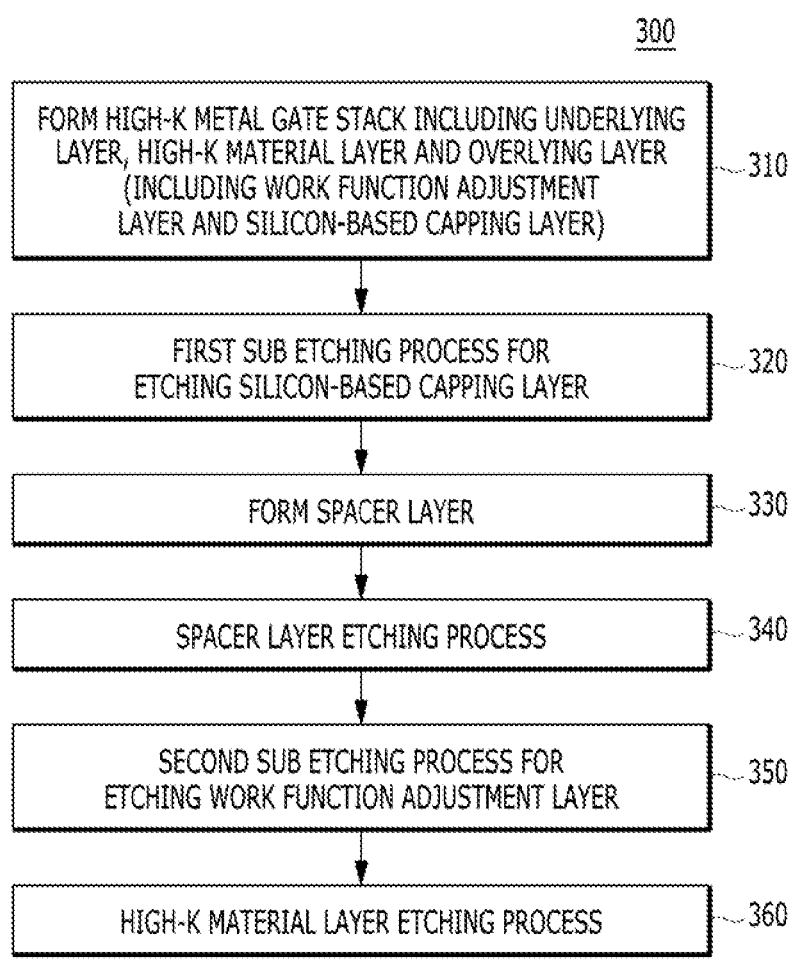
FIG. 3 is a flow chart describing a method for manufacturing a high-k metal gate structure in accordance with a second embodiment.

FIG. 3 is a flow chart describing a method for manufacturing a high-k metal gate structure in accordance with a second embodiment. FIG. 3 shows a process 300 performed for a high-k metal gate stack. The process 300 may include a plurality of processes performed for the high-k metal gate stack.

FIGS. 4A to 4F are cross-sectional views describing a method for manufacturing the high-k metal gate structure in accordance with the second embodiment. The process 300 in accordance with the second embodiment may include a first process 310, a second process 320, a third process 330, a fourth process 340, a fifth process 350, and a sixth process 360. The first process 310 and the third process 330 may be deposition processes, and the second process 320, the fourth process 340, the fifth process 350 and the sixth process 360 may be etching processes. The second process 320, the fifth process 350 and the sixth process 360 may be etching processes for etching of a high-k metal gate stack 400.

Figure 4A:
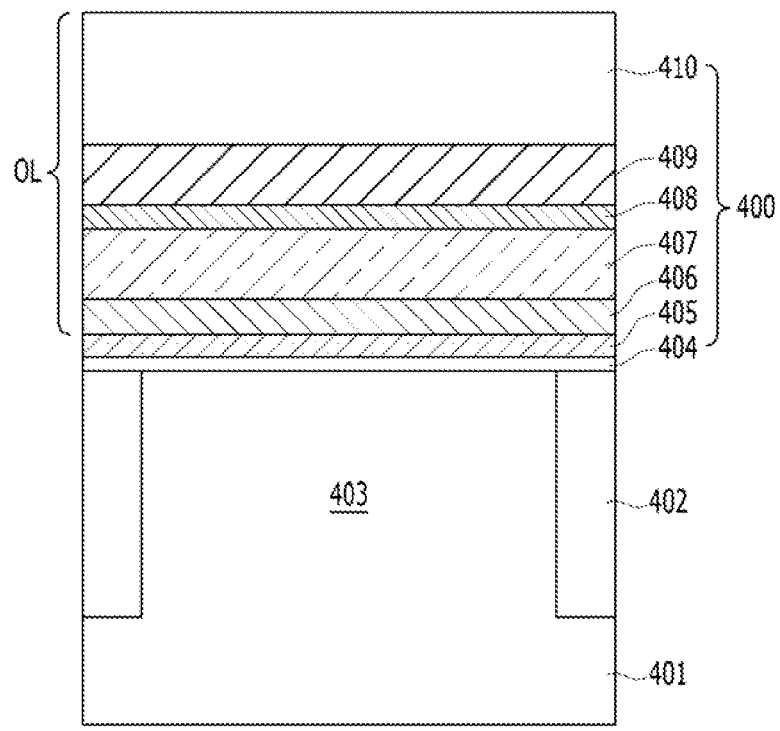
FIGS. 4A to 4F are cross-sectional views describing a method for manufacturing the high-k metal gate structure in accordance with the second embodiment.
Figure 4B:
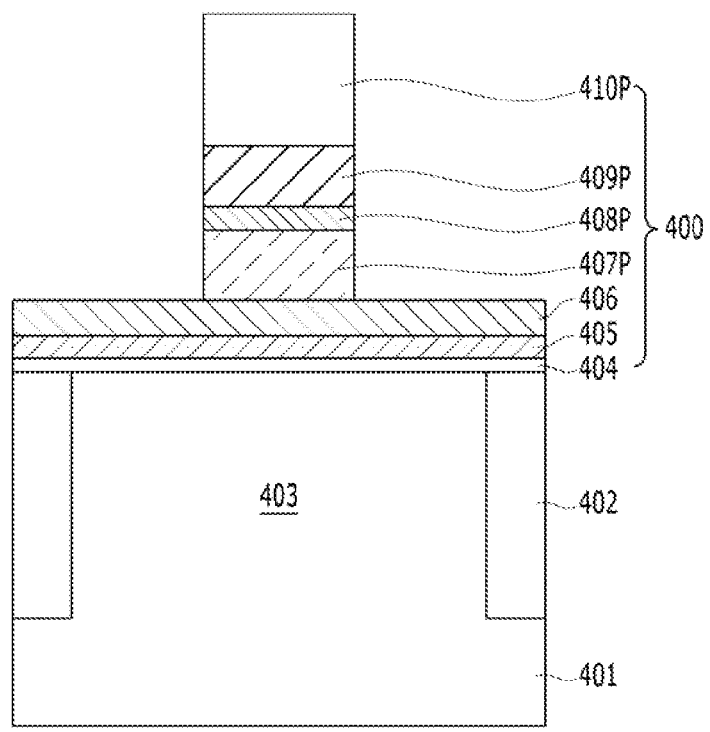

In the first process 310, the high-k metal gate stack 400 may be formed on a substrate 401 (see FIG. 4A). Regarding the substrate 401, isolation regions 402 and an active region 403, reference may be made to the first embodiment. The high-k metal gate stack 400 may be a layered structure of various different layers. The high-k metal gate stack 400 may include a high-k material layer 405 and other material layers. For example, the high-k metal gate stack 400 may include an underlying layer 404, the high-k material layer 405, and an overlying layer OL. The underlying layer 404 may be formed on the substrate 401, and the high-k material layer 405 may be formed on the underlying layer 404. The overlying layer OL may be formed on the high-k material layer 405.

The underlying layer 404 may include a dielectric material. The underlying layer 404 may include a material which has a dielectric constant lower than the high-k material layer 405. The underlying layer 404 may include silicon oxide, silicon oxynitride or a combination thereof. In some embodiments, the underlying layer 404 may be referred to as an interface layer IL. The underlying layer 404 may be formed by thermal oxidation before or after forming the high-k material layer 405. Also, the underlying layer 404 may be a chemical oxide formed by applying a chemical cleaning composition to the substrate 401.

The high-k material layer 405 may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. The high-k material is not limited thereto, and other high-k materials known in the art may be used as well.

The overlying layer OL may include a work function adjustment layer 406, a silicon-based capping layer 407, a barrier layer 408, a metal gate electrode layer 409, and a hard mask layer 410. The work function adjustment layer 406, the barrier layer 408 and the metal gate electrode layer 409 may include a metal and a metal-containing material such as a metal compound. The silicon-based capping layer 407 may include a silicon-containing layer. The work function adjustment layer 406 may include titanium nitride (TiN). The silicon-based capping layer 407 may include polysilicon. The barrier layer 408 may include titanium or titanium nitride. The metal gate electrode layer 409 may include a low resistivity metal such as tungsten (W) and aluminum (Al). The hard mask layer 410 may be formed on the metal gate electrode layer 409. The hard mask layer 410 may include a material which has an etch selectivity with respect to the overlying layer OL and the high-k material layer 405. The hard mask layer 410 may be formed of silicon nitride.

In general, the high-k material layer 405, the work function adjustment layer 406, the silicon-based capping layer 407, the barrier layer 408, the metal gate electrode layer 409, and the hard mask layer 410 may be formed using a deposition process such as chemical vapor deposition (CVD). The chemical vapor deposition (CVD) may include atmospheric pressure chemical vapor deposition (APCVD), low pressure chemical vapor deposition (LPCVD), plasma-enhanced chemical vapor deposition (PECVD) or metal organic chemical vapor deposition (MOCVD). In another embodiment, the layers may be formed using physical vapor deposition (PVD). In still another embodiment, the layers may be formed using atomic layer deposition (ALD).

In the second process 320, the high-k metal gate stack 400 may be partially etched. The second process 320 may include a plurality of sub etching processes for partially etching the overlying layer OL.

Before performing the second process 320, an etching process for the hard mask layer 410 may be performed. A hard mask layer pattern 410P may be formed. While not shown, the hard mask layer 410 may be etched using a photoresist pattern as an etch mask. The photoresist pattern may be formed by a photolithography process generally known in the art. After removing the photoresist pattern, the overlying layer OL may be partially etched using the hard mask layer pattern 410P as an etch mask.

By the second process 320, the metal gate electrode layer 409, the barrier layer 408 and the silicon-based capping layer 407 may be sequentially etched. A metal gate electrode 409P, a barrier layer pattern 408P and a silicon-based capping layer pattern 407P may be formed (see FIG. 4B).

The second process 320 may be performed in a plasma etch reactor. For example, the second process 320 may be performed in an inductively coupled plasma (ICP) reactor. The inductively coupled plasma reactor uses radio frequency (RF) source power to excite plasma in a vacuum chamber. In the inductively coupled plasma reactor, RF power is inductively coupled to a process chamber. Most inductively coupled plasma reactors have an additional radio frequency (RF) generator which is coupled close to a substrate. The additional RF generator is frequently referred to as a bias radio frequency (RF) generator. Bias power is generated by the bias RF generator. In the inductively coupled plasma reactor, the frequency for both source power and bias power may be set to 13.56 MHz.

The second process 320 may include a sub etching process for etching the metal gate electrode layer 409, a sub etching process for etching the barrier layer 408, and a sub etching process for etching the silicon-based capping layer 407.

The plurality of sub etching processes may be performed with a high etch selectivity with respect to the work function adjustment layer 406. In particular, the sub etching process for etching the silicon-based capping layer 407 hereinafter, referred to as a "first sub etching process", may have a high etch selectivity between the silicon-based capping layer 407 and the work function adjustment layer 406. In the first sub etching process, a main etching process and an over etching process may be sequentially performed.

Descriptions will be made below for a main etching process and an over etching process in an embodiment in which the silicon-based capping layer 407 includes polysilicon and the work function adjustment layer 406 includes titanium nitride.

The main etching process may be performed using the plasma of a fluorine-containing gas such as $SF_6$. The over etching process may be performed using an etchant having etch selectivity equal to or higher than 10 with respect to titanium nitride such that etching is stopped at titanium nitride. The over etching process may be performed using the plasma containing a bromine-containing gas and an oxygen-containing gas. For example, the over etching process may be performed using the plasma of $HBr/O_2$. By using the plasma of $HBr/O_2$, it is possible to obtain a high etch selectivity equal to or higher than 10 with respect to titanium nitride. By performing the over etching process using the plasma of $HBr/O_2$, the production of polysilicon residues and an attack to titanium nitride may be prevented.

Figure 4C:
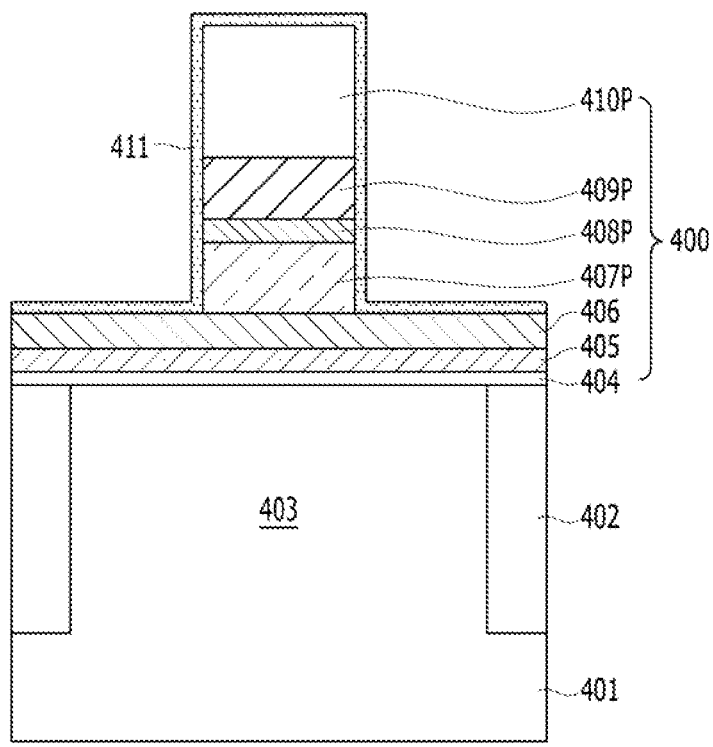
Figure 4D:
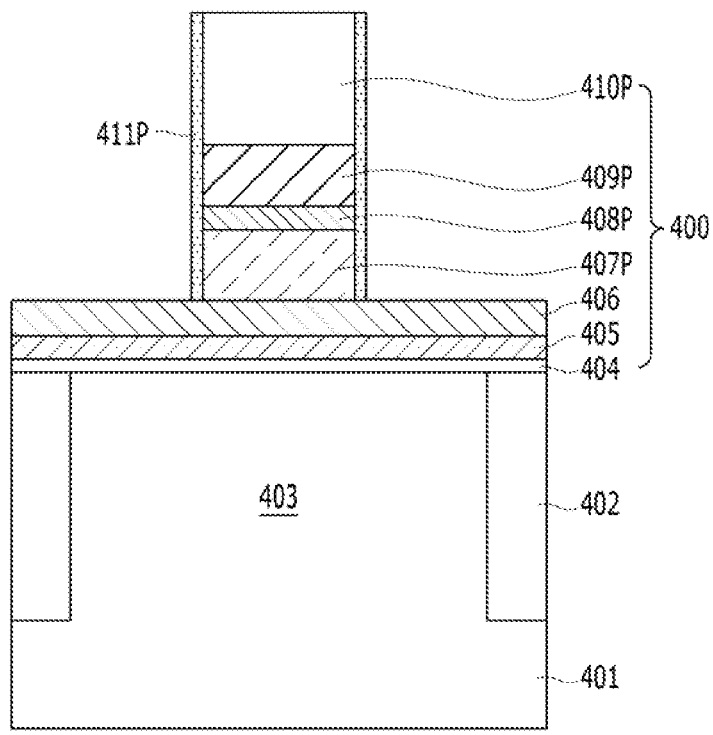
Figure 4E:
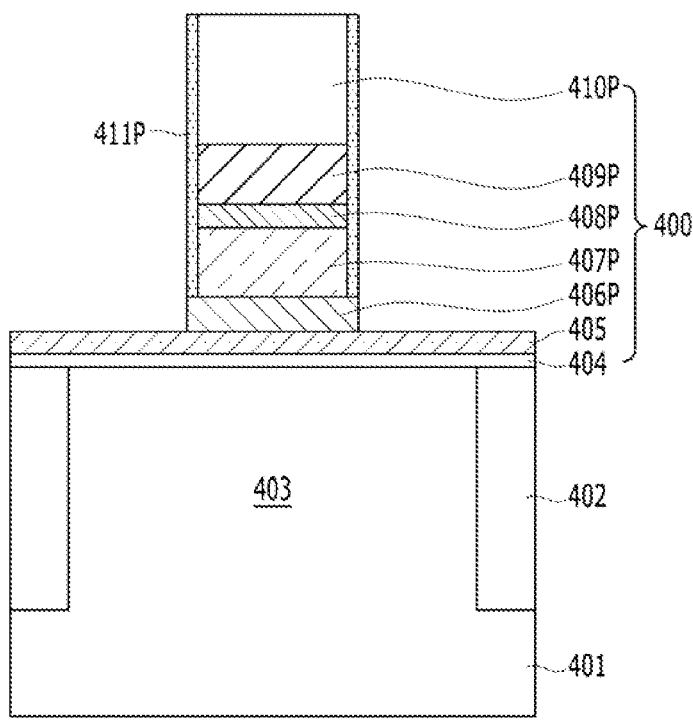
Figure 4F:
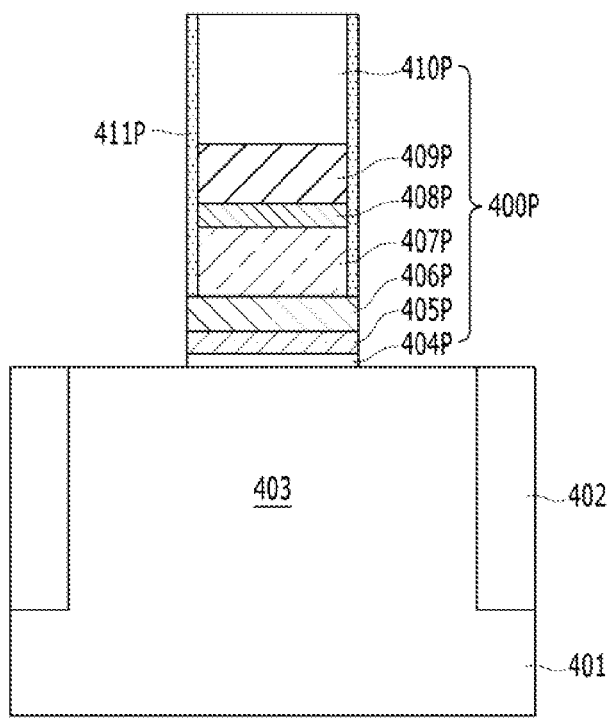

In the third process 330, a spacer layer 411 may be formed (see FIG. 4C). The spacer layer 411 may include a dielectric material. The spacer layer 411 may be formed of a material which has an etch selectivity with respect to the work function adjustment layer 406. The spacer layer 411 may be formed of the same material as the hard mask layer pattern 410P. For example, the spacer layer 411 may include silicon nitride.

In the fourth process 340, the spacer layer 411 may be etched. Spacers 411P may be formed by an etching process for the spacer layer 411 (see FIG. 4D). The spacers 411P may be formed on the sidewalls of the metal gate electrode 409P, the barrier layer pattern 408P, the silicon-based capping layer pattern 407P, and the hard mask layer pattern 410P. The etching process for the spacer layer 411 may be performed in a plasma etch reactor.

The fifth process 350 may include an etching process for etching the remainder of the overlying layer OL. In the fifth process 350, the work function adjustment layer 406 may be etched. The work function adjustment layer 406 may be etched using the spacers 411P and the hard mask layer pattern 410P as an etch mask. A work function adjustment layer pattern 406P may be formed (see FIG. 4E). An etching process for the work function adjustment layer 406 may be performed with using an etchant having a high etch selectivity with respect to the other materials.

The fifth process 350 may be performed in a plasma etch reactor in the same manner as the second process 320. For example, the fifth process 350 may be performed in an ICP reactor.

The etching process for etching the work function adjustment layer 406 hereinafter, referred to as a "second sub etching process" will be described below. For an embodiment in which the work function adjustment layer 406 includes titanium nitride, the second sub etching process will be described.

The second sub etching process for etching titanium nitride may be performed using an etchant having an etch selectivity equal to or higher than 14 with respect to the high-k material layer 405. For example, the second sub etching process may be performed using plasma including a chlorine-containing gas and an argon (Ar) gas. The second sub etching process may be performed using the plasma of $Cl_2$/Ar. By using the plasma of $Cl_2$/Ar, it is possible to obtain a high etch selectivity equal to or higher than 14 with respect to the high-k material layer 405. By using the $Cl_2$/Ar plasma, titanium nitride may be easily etched while preventing an attack to the high-k material layer 405.

In the sixth process 360, the high-k material layer 405 may be etched. A high-k material layer pattern 405P may be formed (see FIG. 4F). An etching process for the high-k material layer 405 may be performed using an etchant having a high etch selectivity with respect to the other materials.

The etching process for etching the high-k material layer 405 hereinafter, referred to as a "high-k material layer etching process", will be described below. For an embodiment in which the work function adjustment layer 406 includes titanium nitride and the high-k material layer 405 includes hafnium oxide, a high-k material layer etching process will be described.

To prevent pitting and excessive substrate recessing due to a low etch selectivity with respect to the substrate 401 and the underlying layer 404, the etching process for the high-k material layer 405 may be performed by controlling bias power and source power. In particular, to prevent the production of etching residues and excessive substrate recessing, bias power may be selected in the range of 15 W to 25 W.

As an etchant, the plasma of a main etch gas may be used. Further, by including an additive gas capable of increasing an etch selectivity with respect to the substrate 401 and the underlying layer 404, the etching process may be performed. The main etch gas may include at least one species. One of species may include chlorine. The main etch gas may include a chlorine-containing gas. In another embodiment, the main etch gas may include boron and chlorine. For example, the main etch gas may include $BCl_3$. The additive gas may include argon (Ar). To prevent excessive recessing of the substrate 401, an amount of the additive gas may be the same as the main etch gas. An etch selectivity of the high-k material layer 405 with respect to the substrate 401 may be increased.

To increase the volatility of an etch byproduct containing the species of the main etch gas, the etching process may be performed at a high temperature. The etching process for the high-k material layer 405 may be performed at a higher temperature than the etching process for the overlying layer OL. The etching process for the overlying layer OL may be performed in a low temperature chamber, and the etching process for the high-k material layer 405 may be performed in a high temperature chamber. For example, the etching process for the overlying layer OL may be performed in a low temperature chamber at 50 degrees Celsius. The etching process for the high-k material layer 405 may be performed in a high temperature chamber 220 degrees Celsius. As the etching process for the high-k material layer 405 is performed at a high temperature, the volatility of an etch byproduct may be increased. As the volatility of an etch byproduct increases, the amount of a nonvolatile etch byproduct may be decreased. As a consequence, When the etching process for the high-k material layer 405 is performed at a high temperature, it is possible to prevent re-deposition of a nonvolatile etch byproduct on the sidewalls of the high-k material layer pattern 405P.

In the sixth process 360, after the etching process for the high-k material layer 405, a wet cleaning process may be performed so that residues may be cleanly removed. The wet cleaning process may be performed using a hydrogen fluoride (HF)-based solution. The underlying layer 404 may be etched by such a wet etching process, and in this case, an etching process for the underlying layer 404 may be omitted.

By the process 300 as described above, a high-k metal gate structure 400G may be formed on the substrate 401. The high-k metal gate structure 400G may include an underlying layer pattern 404P, the high-k material layer pattern 405P, the work function adjustment layer pattern 406P, the silicon-based capping layer pattern 407P, the barrier layer pattern 408P, the metal gate electrode 409P and the hard mask layer pattern 410P.

Figure 5:
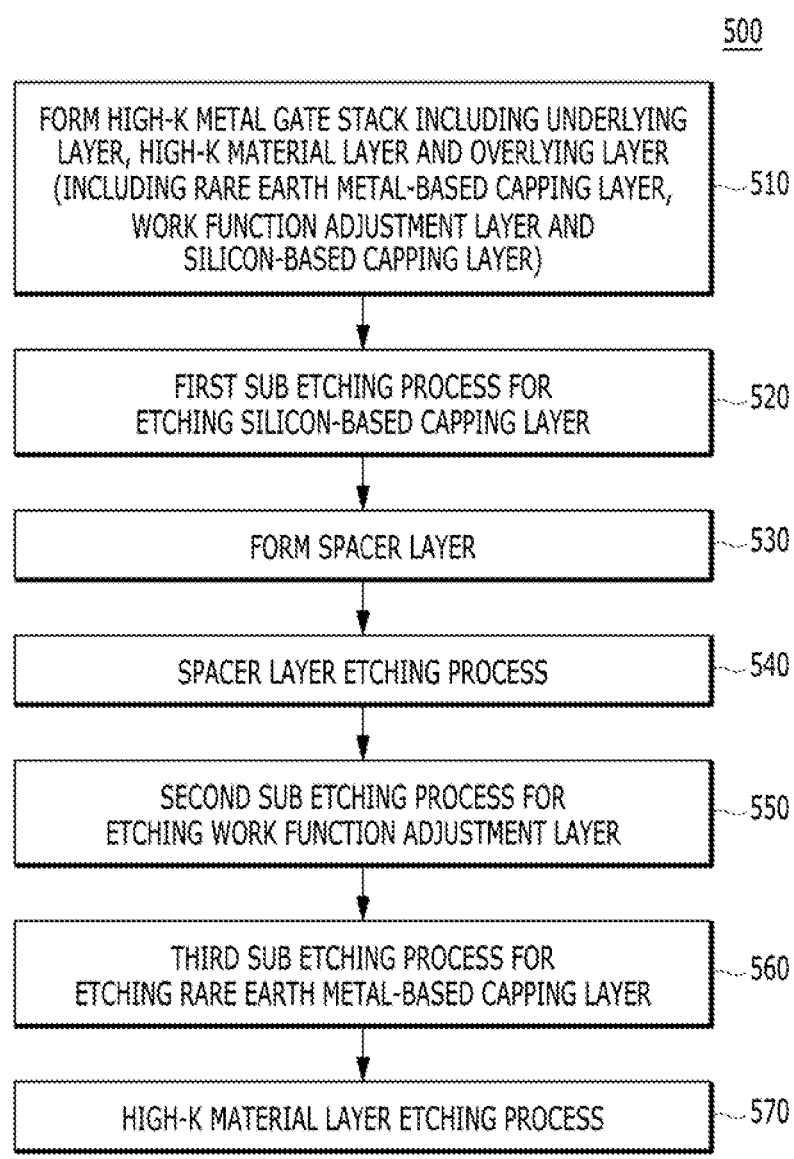
FIG. 5 is a flow chart describing a method for manufacturing a high-k metal gate structure in accordance with a third embodiment.

FIG. 5 is a flow chart describing a method for manufacturing a high-k metal gate structure in accordance with a third embodiment. FIG. 5 shows a process 500 performed for a high-k metal gate stack. The process 500 may include a plurality of processes performed for the high-k metal gate stack.

The process 500 in accordance with the third embodiment may include a first process 510, a second process 520, a third process 530, a fourth process 540, a fifth process 550, a sixth process 560, and a seventh process 570. The first process 510 and the third process 530 may be deposition processes, and the second process 520, the fourth process 540, the fifth process 550, the sixth process 560 and the seventh process 570 may be etching processes. The second process 520, the fifth process 550, the sixth process 560 and the seventh process 570 may be etching processes for etching of a high-k metal gate stack.

Figure 6:
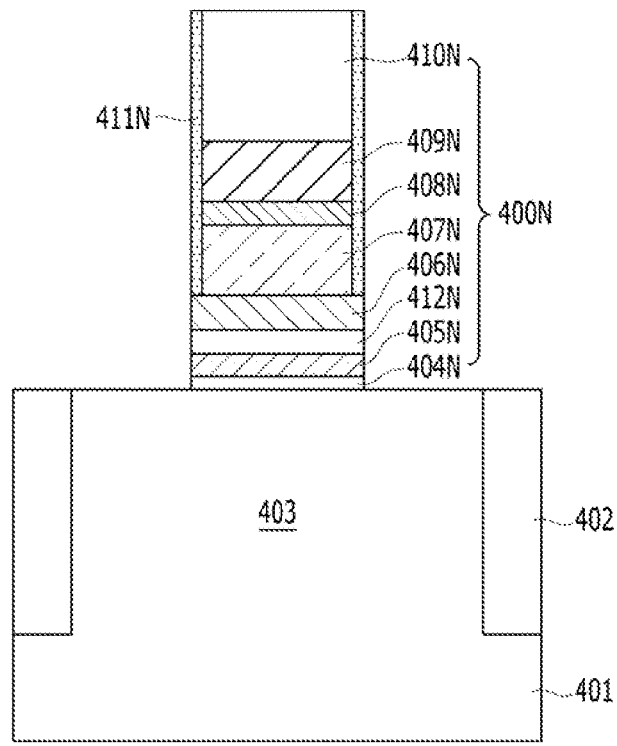
FIG. 6 is a cross-sectional view describing a method for manufacturing the high-k metal gate structure in accordance with the third embodiment.

FIG. 6 is a cross-sectional view illustrating the high-k metal gate structure in accordance with the third embodiment.

In a high-k metal gate structure 400N in accordance with the third embodiment, remaining material layers may be the same as the second embodiment, except a rare earth metal-based capping layer pattern 412N. For example, the high-k metal gate structure 400N may include an underlying layer pattern 404N, a high-k material layer pattern 405N, the rare earth metal-based capping layer pattern 412N, a work function adjustment layer pattern 406N, a silicon-based capping layer pattern 407N, a barrier layer pattern 408N, a metal gate electrode 409N, and a hard mask layer pattern 410N.

Accordingly, the second process 520 may include a first sub etching process for forming the silicon-based capping layer pattern 407N. The fifth process 550 may include a second sub etching process for forming the work function adjustment layer pattern 406N. The sixth process 560 may include a third sub etching process for forming the rare earth metal-based capping layer pattern 412N. The seventh process 570 may include a high-k material layer etching process.

The first sub etching process, the second sub etching process and the high-k material layer etching process may be performed in the same manner as in the second embodiment.

The third sub etching process for forming the rare earth metal-based capping layer pattern 412N may be performed using an etchant having a high etch selectivity with respect to a high-k material layer. The third sub etching process may be performed using the plasma of a chlorine-containing gas. For example, the third sub etching process may be performed using HCl. In another embodiment, the third sub etching process may be performed by a wet etching process using an HCl solution. In this case, a substrate may be unloaded from a plasma reactor to perform the wet etching process. The high-k metal gate structure 400N in accordance with the third embodiment may be applied to an N channel transistor.

Figure 7:
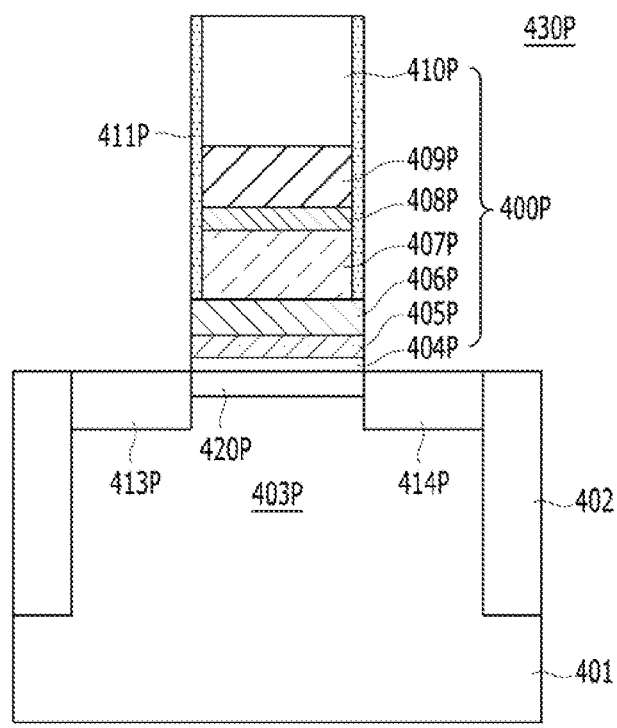
FIG. 7 is a cross-sectional view illustrating a P channel transistor to which the second embodiment is applied.

FIG. 7 is a cross-sectional view illustrating a P channel transistor to which the second embodiment is applied. Referring to FIG. 7, a P channel transistor 430P includes a P channel region 420P formed in an active region 403P, and a high-k metal gate structure 400P on the P channel region 420P. The P channel region 420P is formed between a P type source region 413P and a P type drain region 414P.

The active region 403P may include a doped region. The doped region is not illustrated in the drawing. The doped region may form a "well region". A dopant for the well region may be introduced into the active region 403P through ion implantation. The well region for the P channel transistor 430P may be doped with an N type dopant.

The P channel region 420P may be formed in the top surface part of the active region 403P. The P channel region 420P may include a composition of silicon and germanium, such as silicon germanium (SiGe). A layer of a silicon-germanium-containing composition hereinafter, referred to as a silicon-germanium-containing layer, may be deposited on the active region 403P. The silicon-germanium-containing layer may be deposited using an epitaxial deposition process. The silicon-germanium-containing layer may be formed by performing germanium implantation in the top surface part of the active region 403P.

The high-k metal gate structure 400P may be positioned on the P channel region 420P. The high-k metal gate structure 400P may include an interface layer pattern 404P, a high-k material layer pattern 405P, a work function adjustment layer pattern 406P, a silicon-based capping layer pattern 407P, a barrier layer pattern 408P, a metal gate electrode 409P, and a hard mask layer pattern 410P. The high-k metal gate structure 400P may further include spacers 411P.

The work function adjustment layer pattern 406P may have a work function appropriate to shift a threshold voltage of the P channel transistor 430P. The threshold voltage denotes a voltage at which a gate of a transistor turns on to form a conductive channel. The work function adjustment layer pattern 406P may include a work function adjustment material capable of shifting a threshold voltage. By the work function adjustment material, a negative threshold voltage shift or a positive threshold voltage shift may occur. The negative threshold voltage shift may occur by an N type work function adjustment element. This may be referred to as an N type threshold voltage shift. The positive threshold voltage shift may occur by a P type work function adjustment element. This may be referred to as a P type threshold voltage shift. The N type threshold voltage shift means a shift in Fermi energy toward the conduction band of silicon. The P type threshold voltage shift means a shift in Fermi energy toward the valence band of silicon.

A positive threshold voltage shift may occur by the work function adjustment layer pattern 406P. The work function adjustment layer pattern 406P may be selected among an elemental metal, a ternary metal, a metal alloy and a conductive metal compound. An example of a material appropriate for the work function adjustment layer pattern 406P may include tantalum, titanium, hafnium, zirconium, tungsten, molybdenum, a nitride thereof, a carbide compound thereof, or a combination thereof. For example, the work function adjustment layer pattern 406P may include titanium nitride.

The silicon-based capping layer pattern 407P may be selected to prevent the reaction between the work function adjustment layer pattern 406P and the metal gate electrode 409P. A work function variation of the work function adjustment layer pattern 406P may be prevented. The silicon-based capping layer pattern 407P may include a silicon-containing material. The silicon-based capping layer pattern 407P may include silicon, monocrystalline silicon, polysilicon, amorphous silicon, carbon-doped silicon, or a combination thereof. Also, the silicon-based capping layer pattern 407P may include another semiconductor material such as silicon germanium. The silicon-based capping layer pattern 407P may include polysilicon doped with an impurity. The silicon-based capping layer pattern 407P may prevent oxidation of the work function adjustment layer pattern 406P.

The barrier layer pattern 408P may be selected to prevent the reaction between the silicon-based capping layer pattern 407P and the metal gate electrode 409P. The barrier layer pattern 408P may include titanium nitride.

The metal gate electrode 409P may be selected to reduce resistivity of the high-k metal gate structure 400P. The metal gate electrode 409P may include a low resistivity metal. The metal gate electrode 409P may be selected among an elemental metal, a ternary metal, a metal alloy and a conductive metal compound. The metal gate electrode 409P may include tungsten.

Figure 8:
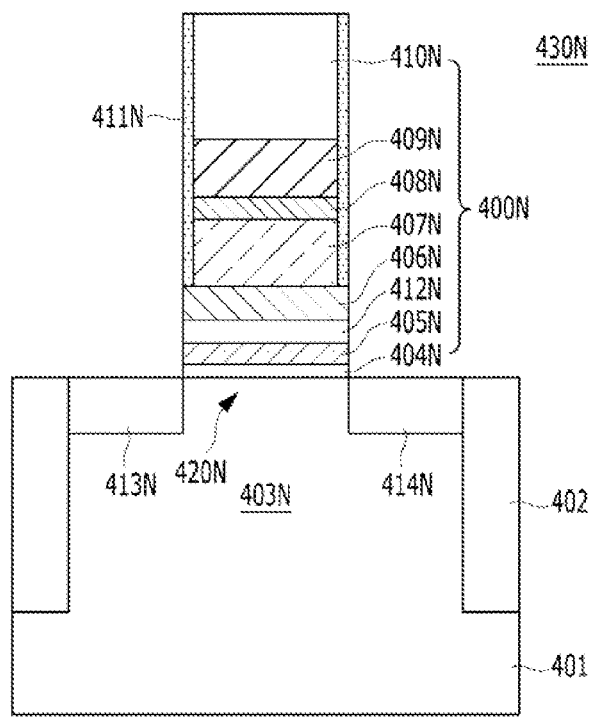
FIG. 8 is a cross-sectional view illustrating an N channel transistor to which the third embodiment is applied.

FIG. 8 is a cross-sectional view illustrating an N channel transistor to which the third embodiment is applied. Referring to FIG. 8, an N channel transistor 430N includes an N channel region 420N formed in an active region 403N, and a high-k metal gate structure 400N on the N channel region 420N. The N channel region 420N is formed between an N type source region 413N and an N type drain region 414N.

The active region 403N may include a doped region. The doped region is not illustrated in the drawing. The doped region may form a "well region". A dopant for the well region may be introduced into the active region 403N through ion implantation. The well region for the N channel transistor 430N may be doped with a P type dopant.

The N channel region 420N may be formed in the top surface part of the active region 403N. The N channel region 420N may be a silicon channel. The high-k metal gate structure 400N may be positioned on the N channel region 420N. The high-k metal gate structure 400N may include an interface layer pattern 404N, a high-k material layer pattern 405N, a rare earth metal-based capping layer pattern 412N, a work function adjustment layer pattern 406N, a silicon-based capping layer pattern 407N, a barrier layer pattern 408N, a metal gate electrode 409N, and a hard mask layer pattern 410N.

The rare earth metal-based capping layer pattern 412N may be a material which includes a dipole-forming species. The dipole-forming species may form dipoles at an interface between the rare earth metal-based capping layer pattern 412N and the high-k material layer pattern 405N. A negative threshold voltage shift may occur by the dipoles. The rare earth metal-based capping layer pattern 412N may include a material which contains lanthanum. The rare earth metal-based capping layer pattern 412N may include lanthanum oxide. As lanthanum oxide is applied, advantages are provided in terms of a low threshold voltage, excellent carrier mobility, and effective oxide thickness (EOT) scaling.

In the N channel transistor 430N, a negative threshold voltage shift may occur by the rare earth metal-based capping layer pattern 412N and the work function adjustment layer pattern 406N. The interface layer pattern 404N, the high-k material layer pattern 405N, the work function adjustment layer pattern 406N, the silicon-based capping layer pattern 407N, the barrier layer pattern 408N, the metal gate electrode 409N, and the hard mask layer pattern 410N may be the same as those of the high-k metal gate structure 400P.

Figure 9:
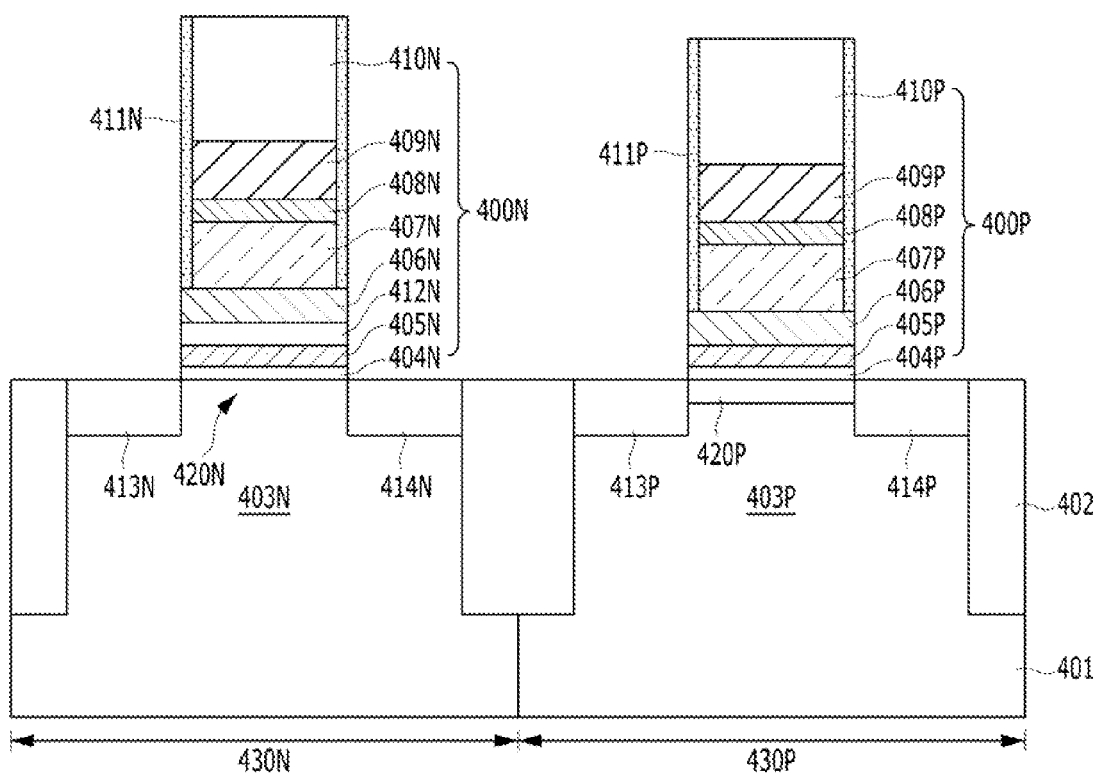
FIG. 9 is a cross-sectional view illustrating a CMOS transistor to which the second embodiment and the third embodiment are applied.

FIG. 9 is a cross-sectional view illustrating a CMOS transistor to which the second embodiment and the third embodiment are applied. Referring to FIG. 9, a CMOS transistor may include a P channel transistor 430P and an N channel transistor 430N. The P channel transistor 430P may include a high-k metal gate structure 400P. The N channel transistor 430N may include a high-k metal gate structure 400N. Regarding the P channel transistor 430P and the N channel transistor 430N, reference may be made to the second embodiment and the third embodiment, respectively.

As shown in FIG. 9, the high-k metal gate structure 400P and the high-k metal gate structure 400N may be positioned in different regions, respectively. Stacked layers of the high-k metal gate structure 400P are different from of stacked layers of the high-k metal gate structure 400N.

To form the high-k metal gate structure 400P and the high-k metal gate structure 400N, the same etching process may be used. That is, the high-k metal gate structure 400P and the high-k metal gate structure 400N may be simultaneously patterned and etched without causing an etching defect such as excessive substrate recessing and undercutting.

Figure 10A:
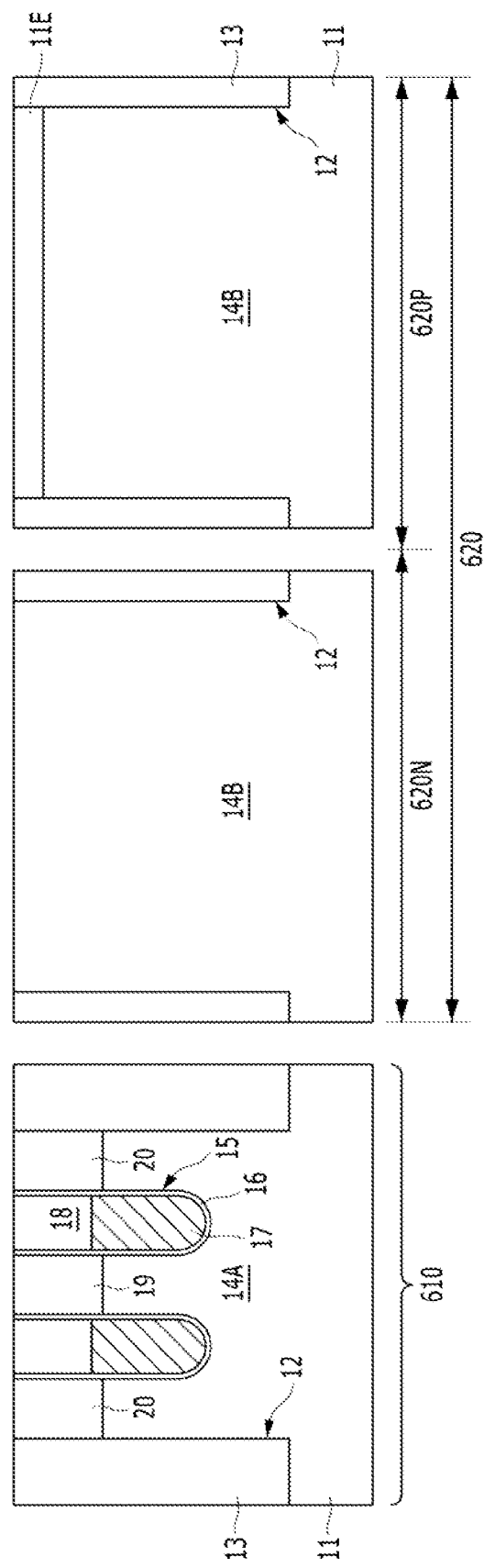

FIGS. 10A to 10I are cross-sectional views illustrating a method for manufacturing a memory device to which the embodiments are applied. Referring to FIG. 10A, a substrate 11 is prepared. The substrate 11 may include a memory cell region 610 and a peripheral circuit region 620. A plurality of memory cells may be formed in the memory cell region 610. In each memory cell, a cell transistor, a bit line and a memory element may be formed.

A peripheral transistor which constructs a peripheral circuit may be formed in the peripheral circuit region 620. The peripheral circuit region 620 may include a first peripheral circuit region 620P and a second peripheral circuit region 620N. The substrate 11 may include a semiconductor material. The substrate 11 may include a silicon substrate, a silicon germanium substrate or a silicon-on-insulator (SOI) substrate. The memory cell region 610 may be referred to as a first region, and the peripheral circuit region 620 may be referred to as a second region.

An isolation layer 13 may be formed in the substrate 11. The isolation layer 13 may be formed through a shallow trench isolation (STI) process. The isolation layer 13 is formed in first trenches 12. The first trenches 12 may be referred to as 'isolation trenches'. A plurality of first active regions 14A may be defined in the memory cell region 610 by the isolation layer 13. Also, a plurality of second active regions 14B may be defined in the peripheral circuit region 620 by the isolation layer 13. The first active regions 14A may have shapes which are isolated by the isolation layer 13. The isolation layer 13 may include silicon nitride, silicon oxide or a combination thereof.

A plurality of second trenches 15 may be formed in the memory cell region 610. By etching the substrate 11, the second trenches 15 may be formed. The second trenches 15 may have a depth shallower than the first trenches 12. The second trenches 15 may have line shapes which extend in a first direction. The second trenches 15 may be formed by etching the first active regions 14A and the isolation layer 13. The second trenches 15 may be formed to cross the first active regions 14A and the isolation layer 13.

The second trench 15 may include a first portion and a second portion. The first portion and the second portion of the second trench 15 may be continuous. The first portion of the second trench 15 may be formed in the first active region 14A, and the second portion of the second trench 15 may be formed in the isolation layer 13. In another embodiment, the second portion of the second trench 15 may have a depth deeper than the first portion to form a fin region (not shown). The fin region may be referred to as a 'fin channel region'. The bottom corner of the second trench 15 may have a rounding profile. As the rounding profile is formed on the bottom corner of the second trench 15, current leakage may be reduced. The second trenches 15 may also be referred to as 'gate trenches'.

A first gate dielectric layer 16 may be formed. The first gate dielectric layer 16 may be formed in the memory cell region 610. The first gate dielectric layer 16 may be referred to as a cell gate dielectric layer. The first gate dielectric layer 16 may be formed on the bottoms and the sidewalls of the second trenches 15. The first gate dielectric layer 16 may be formed through thermal oxidation. In another embodiment, the first gate dielectric layer 16 may be formed through chemical vapor deposition (CVD) or atomic layer deposition (ALD). The first gate dielectric layer 16 may include a high-k material, an oxide, a nitride, an oxynitride or a combination thereof. The high-k material may be a dielectric material which has a dielectric constant higher than an oxide or a nitride. For example, the high-k material may include hafnium oxide ($HfO_2$), hafnium silicate (HfSiO), hafnium silicate nitride (HfSiON) or a combination thereof.

A plurality of buried word lines 17 may be formed in the memory cell region 610. The buried word lines 17 may cross the plurality of first active regions 14A. A gate conductive layer (not shown) may be formed on the first gate dielectric layer 16 and fill the second trenches 15. By etching back the gate conductive layer, the buried word lines 17 may be formed to be positioned in the second trenches 15. The buried word lines 17 may extend in the first direction. The top surfaces of the buried word lines 17 may be positioned at a level lower than the top surfaces of the first active regions 14A. The distance between the buried word lines 17 and a plug to be subsequently formed may be lengthened. The buried word lines 17 may include titanium, tantalum, tungsten, tantalum nitride, titanium nitride, tungsten nitride or a combination thereof. For example, buried word lines 17 may be formed by stacking tungsten (W) on titanium nitride (TiN). In another embodiment, the buried word lines 17 may include a work function metal layer.

A pair of second trenches 15 may cross the first active region 14A. Accordingly, a pair of buried word lines 17 may cross a single first active region 14A. A plurality of buried word lines 17 may extend parallel in the first direction.

A sealing layer 18 may be formed on the buried word lines 17. The sealing layer 18 may fill the second trenches 15 on the buried word lines 17. The sealing layer 18 may play the role of protecting the buried word lines 17 in a subsequent process. The top surface of the sealing layer 18 may be positioned at the same level as the top surfaces of the first active regions 14A. The sealing layer 18 may include a dielectric material. The sealing layer 18 may include silicon oxide, silicon nitride or a combination thereof.

An impurity may be doped into the first active regions 14A by using the sealing layer 18 as a mask. A first impurity region 19 and a second Impurity region 20 may be formed in the first active region 14A. The first impurity region 19 and the second impurity region 20 may be formed in the first active region 14A on both sides of the second trenches 15, respectively. The first impurity region 19 may be formed in the first active region 14A between the pair of buried word lines 17. A pair of second impurity regions 20 may be respectively formed in both lateral edge regions of the first active region 14A.

As will be described later, a first plug may be coupled to the first impurity region 19, and second plugs may be coupled to the second impurity regions 20. In order to form the first impurity region 19 and the second impurity regions 20, a doping process such as Implantation, plasma doping (PLAD), and so forth may be performed. The first impurity region 19 and the second impurity regions 20 may be doped with the same conductivity type impurity, for example, an N-type impurity. The first impurity region 19 and the second impurity regions 20 correspond to a source region and drain regions, respectively. In this way, a plurality of buried gate type transistors each including the buried word line 17, the first impurity region 19 and the second impurity region 20 may be formed in the memory cell region 610.

A pair of buried gate type transistors may be formed in one first active region 14A. The pair of buried gate type transistors may share the first impurity region 19. As the buried word line 17 is buried in the second trench 15, a channel region under the buried word line 17 may have a three-dimensional structure. A channel length may be increased. As a result, a short channel effect may be minimized.

A P channel region 11E may be formed on the substrate 11 in the first peripheral circuit region 620P of the peripheral circuit region 620. The P channel region 11E may include a silicon germanium layer.

Figure 10B:
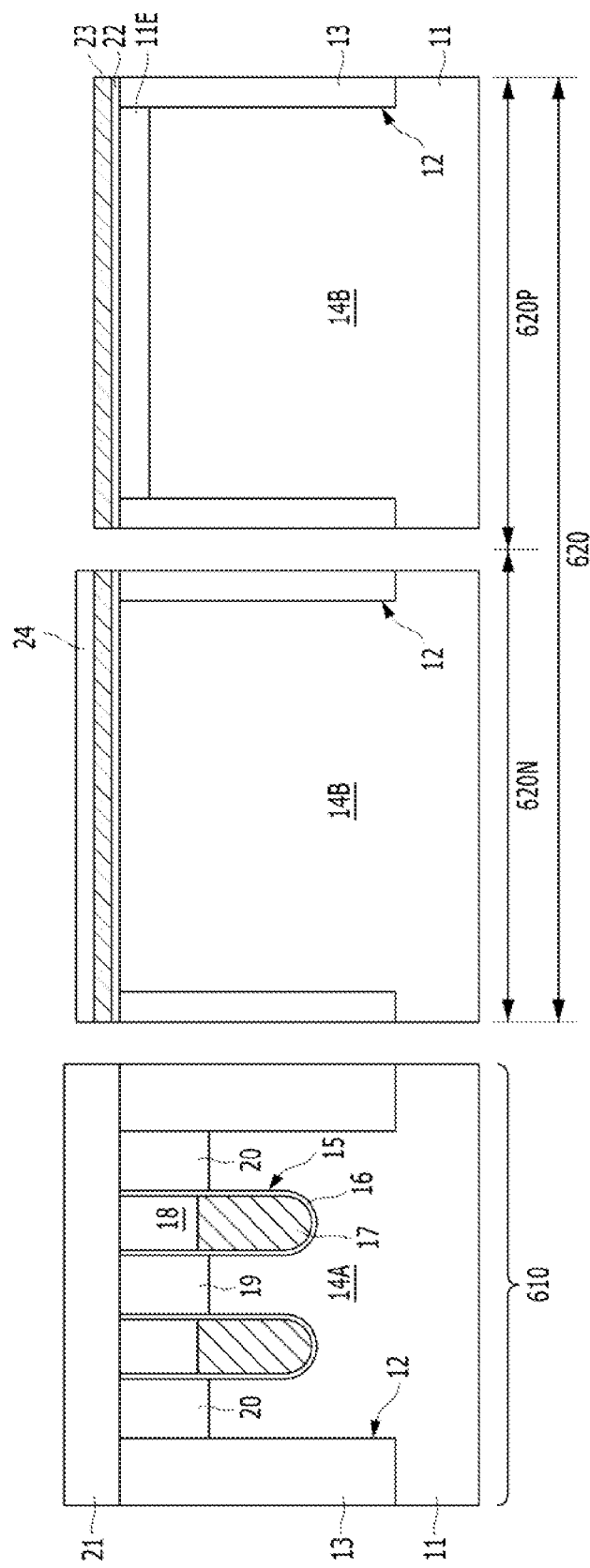

Referring to FIG. 10B, a first interlayer dielectric layer 21 may be formed on the substrate 11. The first interlayer dielectric layer 21 may include silicon oxide, silicon nitride, a low-k material or a combination thereof.

The first interlayer dielectric layer 21 may be patterned. The peripheral circuit region 620 may be open. The first interlayer dielectric layer 21 may remain in the memory cell region 610.

An interface layer 22, a high-k material layer 23, and a rare earth metal-based capping layer 24 may be stacked. The interface layer 22, the high-k material layer 23, and the rare earth metal-based capping layer 24 may be selectively removed from the memory cell region 610. The interface layer 22, the high-k material layer 23, and the rare earth metal-based capping layer 24 may remain on the substrate 11 in the peripheral circuit region 620.

The rare earth metal-based capping layer 24 may be removed from the first peripheral circuit region 620P of the peripheral circuit region 620. The rare earth metal-based capping layer 24 may remain only in the second peripheral circuit region 620N of the peripheral circuit region 620.

Figure 10C:
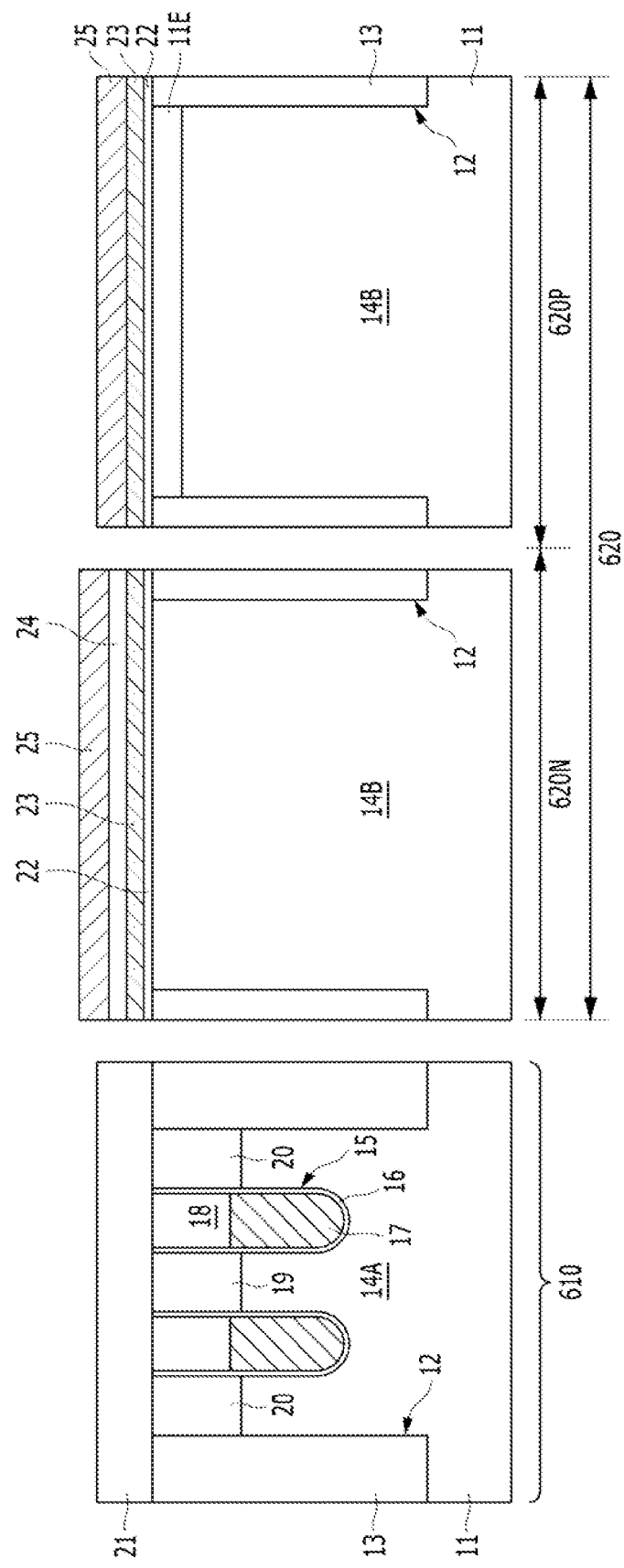

Referring to FIG. 10C, a work function adjustment layer 25 may be formed in the peripheral circuit region 620. The work function adjustment layer 25 may include titanium nitride.

Figure 10D:
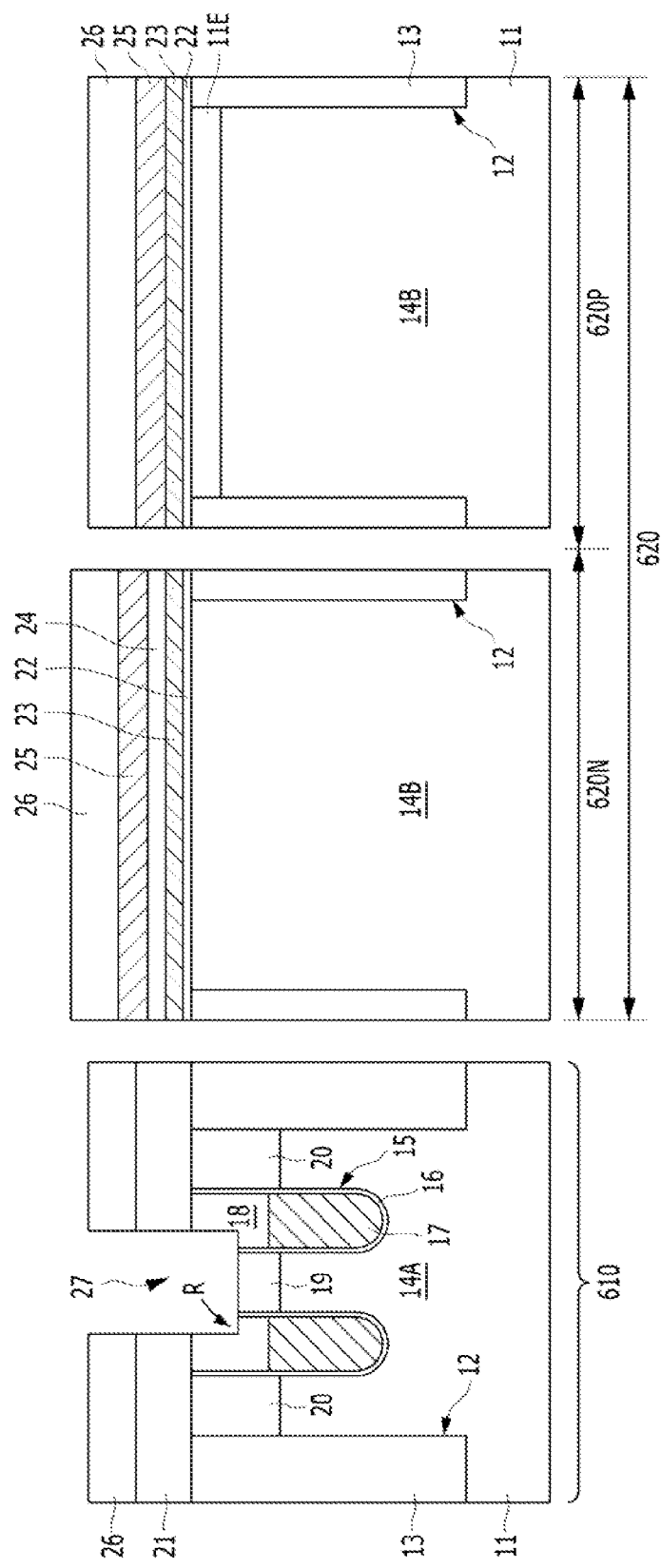

Referring to FIG. 10D, a first mask pattern 26 may be formed. The first mask pattern 26 may be a contact mask pattern. For example, the first mask pattern 26 may be formed using a photoresist pattern. The first mask pattern 26 may cover the peripheral circuit region 620.

A first opening 27 may be formed. The first opening 27 may be formed by etching the first interlayer dielectric layer 21 using the first mask pattern 26 as an etch mask. When viewed from the top, the first opening 27 may have a circular or oval shape. The first opening 27 may be referred to as a "contact hole". In a subsequent process, a first plug may be formed in the first opening 27. A portion of the substrate 11 is exposed by the first opening 27. For example, the first impurity region 19 may be exposed by the first opening 27. The first opening 27 may be formed to be wider than the first impurity region 19. Accordingly, by the first opening 27, portions of the isolation layer 13 and the sealing layer 18 may be exposed around the first impurity region 19.

Next, the first impurity region 19 may be recessed to a predetermined depth (see the reference symbol R). The recessed surface of the first impurity region 19 may be positioned at a level lower than the top surface of the substrate 11. As recessing is performed in this way, the contact resistance between the first impurity region 19 and the first plug, which will be subsequently formed, may be improved. Not only the first impurity region 19 but also a portion of the isolation layer 13 and a portion of the sealing layer 18 neighboring the first impurity region 19 may be recessed. The recess R may be coupled to the first opening 27. The top surfaces of the first impurity region 19, the isolation layer 13 and the sealing layer 18 which are exposed by the recess R may be lower than the top surface of the substrate 11. When the recess R is formed, the top corner of the first opening 27 may be rounded.

Figure 10E:
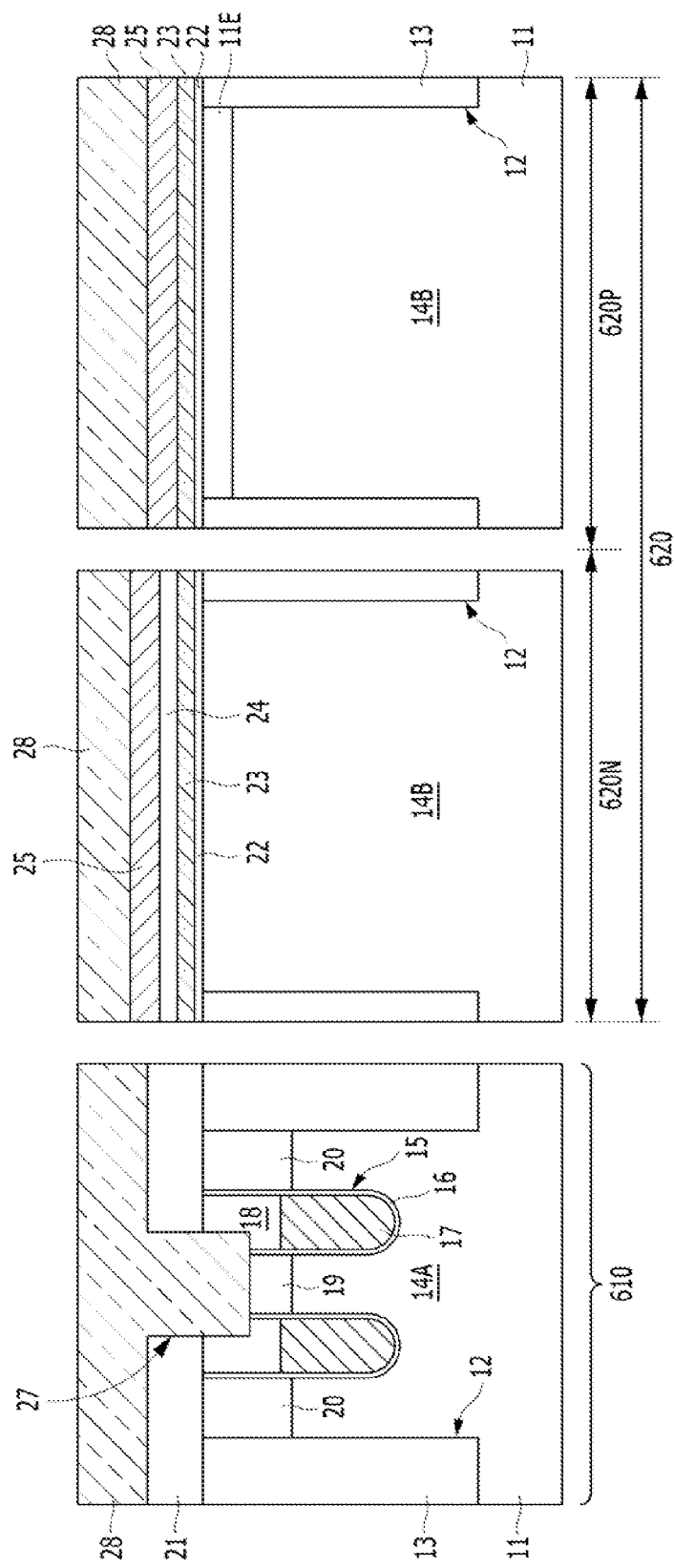

Referring to FIG. 10E, the first mask pattern 26 is removed. A plug conductive layer 28 may fill the first opening 27. The plug conductive layer 28 may be formed to fill the first opening 27 and the recess R. The plug conductive layer 28 may be formed on the work function adjustment layer 25 while filling the first opening 27.

The plug conductive layer 28 may be doped with an impurity. For example, an impurity may be doped by a doping process such as implantation. In an embodiment, the plug conductive layer 28 may include polysilicon.

Figure 10F:
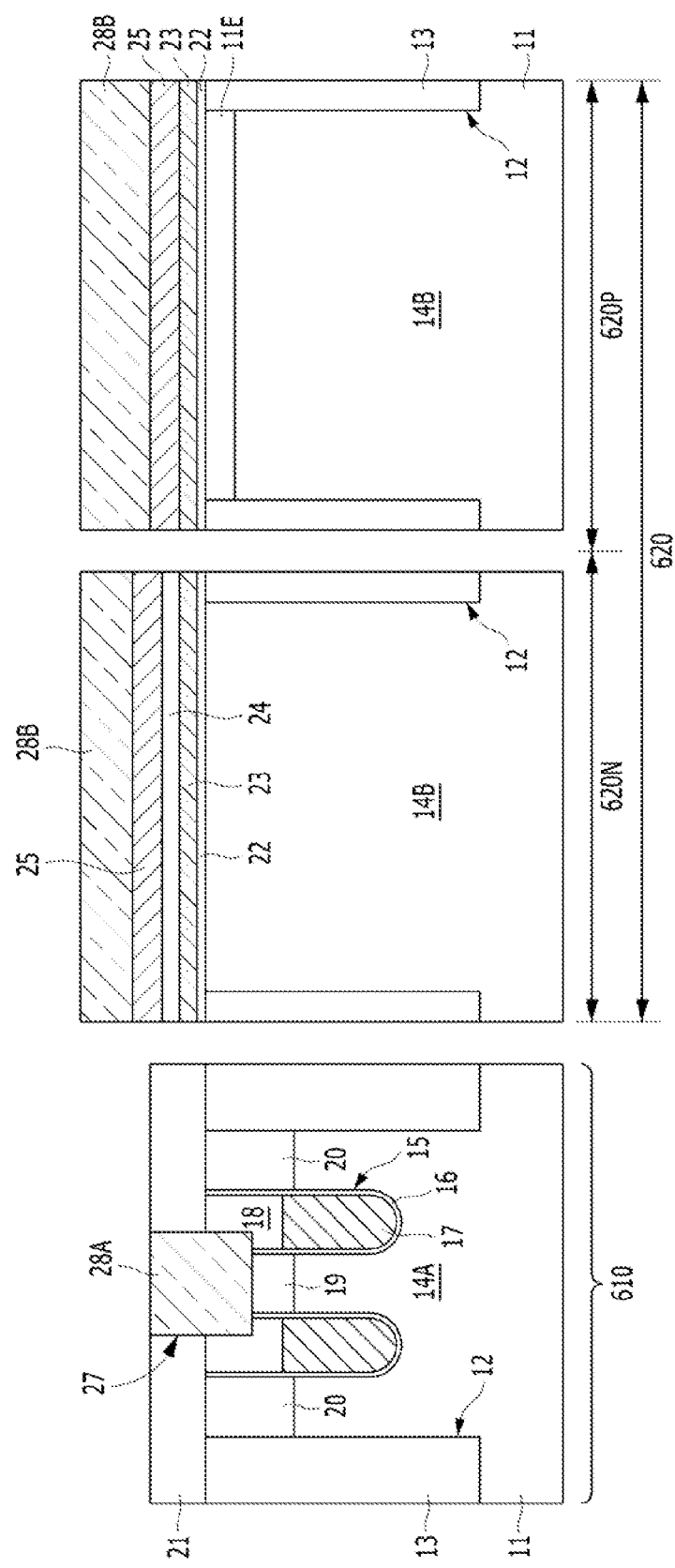

Referring to FIG. 10F, the plug conductive layer 28 may be selectively patterned. A plug pattern 28A may be formed. To form the plug pattern 28A, the plug conductive layer 28 may be planarized in such a manner that the surface of the first interlayer dielectric layer 21 is exposed. Alternatively, the plug conductive layer 28 may be etched back.

Accordingly, the plug pattern 28A which fills the first opening 27 and the recess R is formed. The surface of the plug pattern 28A may be formed at the same level as or at a lower level than the surface of the first interlayer dielectric layer 21.

A plug conductive layer 28B may remain in the peripheral circuit region 620. The plug conductive layer 28B is referred to as a silicon-based capping layer 28B.

The surfaces of the plug pattern 28A and the first Interlayer dielectric layer 21 are exposed in the memory cell region 610, and the top surface of the silicon-based capping layer 28B is exposed in the peripheral circuit region 620.

Figure 10G:
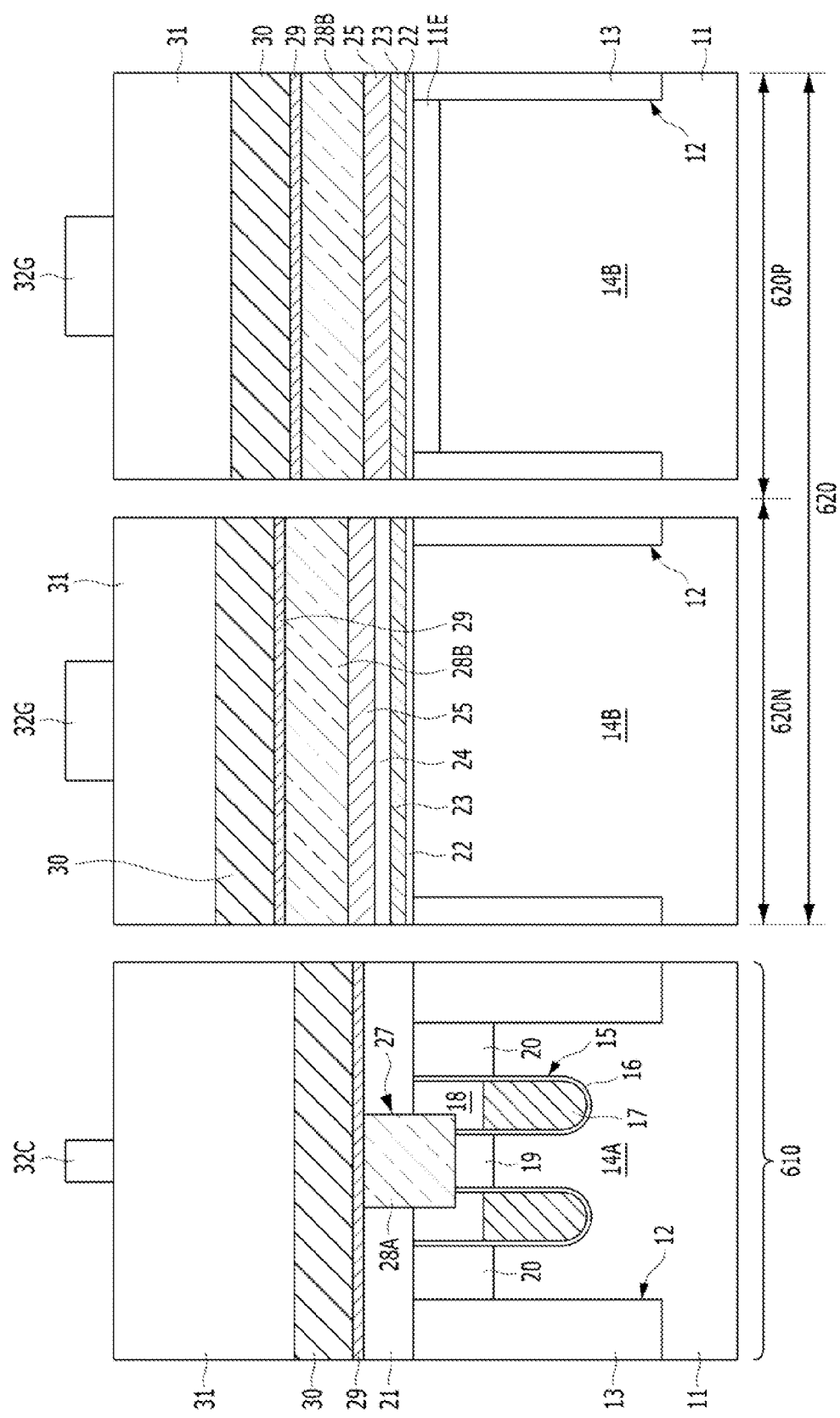

Referring to FIG. 10G, a barrier layer 29 and a bit line conductive layer 30 may be formed on the silicon-based capping layer 28B. A hard mask layer 31 is formed on the bit line conductive layer 30. The bit line conductive layer 30 may be formed of a material which has a specific resistivity lower than the plug pattern 28A. The bit line conductive layer 30 may include a metal material which has a specific resistivity lower than the plug pattern 28A. For example, the bit line conductive layer 30 may include a metal, a metal nitride, a metal silicide or a combination thereof.

In the present embodiment, the bit line conductive layer 30 may include tungsten (W) or a tungsten compound. The barrier layer 29 may include titanium nitride, tantalum nitride, tungsten nitride or a combination thereof. The hard mask layer 31 may be formed of a dielectric material which has etch selectivity with respect to the bit line conductive layer 30 and the plug pattern 28A. The hard mask layer 31 may include silicon oxide, silicon nitride, silicon oxynitride or a combination thereof. In the present embodiment, the hard mask layer 31 is formed of silicon nitride.

In this way, different stacks are formed in the memory cell region 610 and the peripheral circuit region 620. In the second peripheral circuit region 620N of the peripheral circuit region 620, a first stack including the interface layer 22, the high-k material layer 23, the rare earth metal-based capping layer 24, the work function adjustment layer 25, the silicon-based capping layer 28B, the barrier layer 29, the bit line conductive layer 30 and the hard mask layer 31 is formed. In the memory cell region 610, a second stack including the plug pattern 28A, the barrier layer 29, the bit line conductive layer 30 and the hard mask layer 31 is formed. Since the silicon-based capping layer 28B and the plug pattern 28A are formed of the same silicon material, the first stack and the second stack simultaneously include the stack of the same layers that is, a hard mask layer/a bit line conductive layer/a silicon material.

The first stack may be similar to the above-described third embodiment. For example, the interface layer 22 may be an underlying layer, and the rare earth metal-based capping layer 24, the work function adjustment layer 25, the silicon-based capping layer 28B, the barrier layer 29, the bit line conductive layer 30 and the hard mask layer 31 may be an overlying layer.

Third mask patterns 32C and 32G may be formed on the hard mask layer 31. The third mask patterns 32C and 32G may include a photoresist pattern. The third mask patterns 32C and 32G may include a bit line mask 32C and peripheral gate masks 32G. The bit line mask 32C has a line shape which extends in a second direction. The bit line mask 32C may extend in a direction crossing with the buried word lines 17. The bit line mask 32C may have a line width that is smaller than the diameter or width of the first opening 27. The peripheral gate masks 32G may extend in the second direction.

Figure 10I:
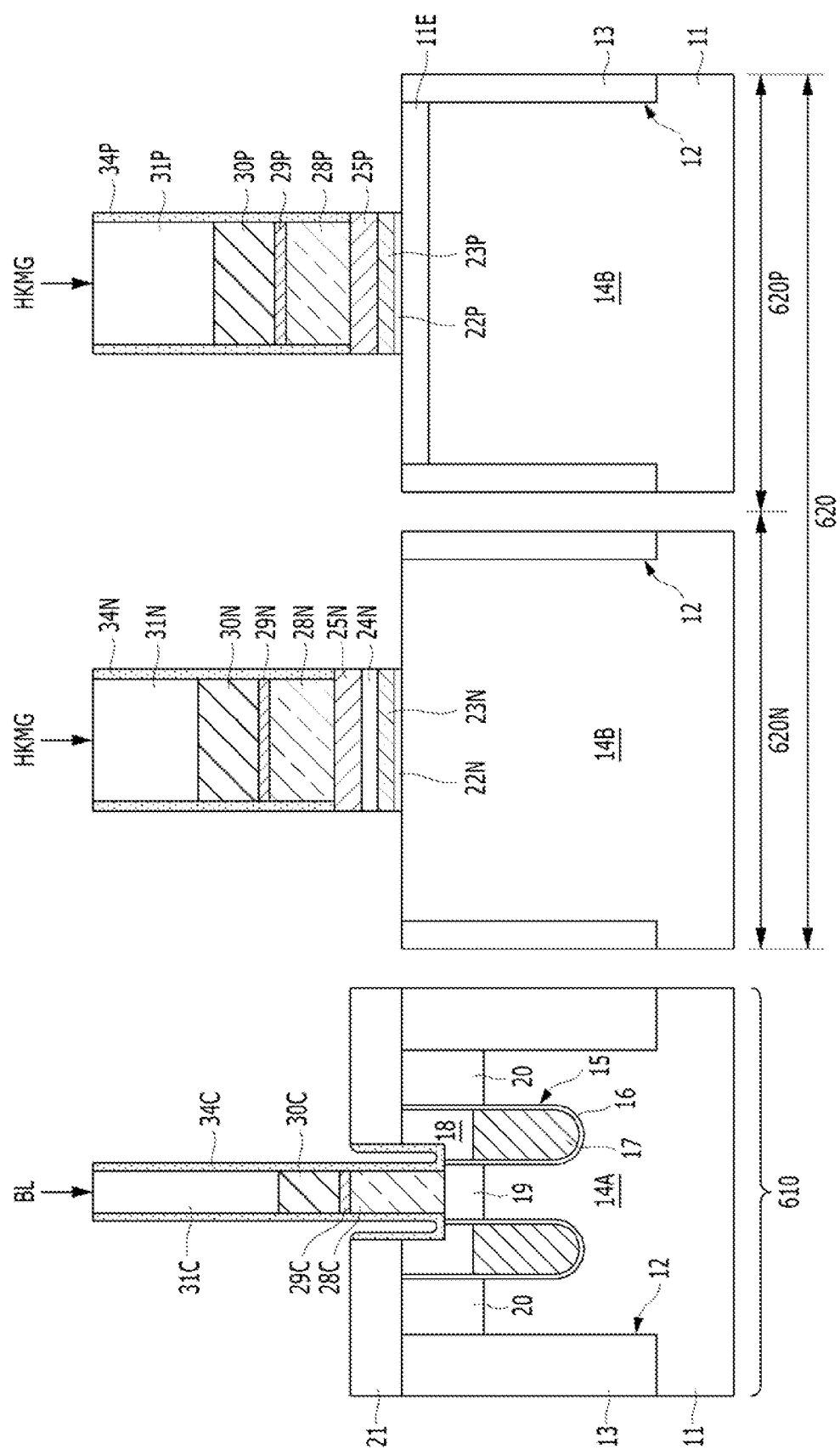

Referring to FIGS. 10H and 10I, a bit line structure BL and high-k metal gate structures HKMG may be formed. The bit line structure BL may be formed in the memory cell region 610, and the high-k metal gate structures HKMG may be formed in the peripheral circuit region 620.

A method for forming the bit line structure BL will be described below. By using the bit line mask 32C as an etch mask, the hard mask layer 31, the bit line conductive layer 30, and the barrier layer 29 are etched. A bit line 30C and a bit line hard mask 31C may be formed. The bit line hard mask 31C is formed by etching of the hard mask layer 31.

The plug pattern 28A is etched using the bit line mask 32C as an etch mask so that a plug 28C is formed. The plug pattern 28A may be etched to have the same line width as the bit line 30C. The plug 28C is formed on the first impurity region 19. The plug 28C electrically couples the first impurity region 19 and the bit line 30C with each other. The plug 28C is formed in the first opening 27 and the recess R. The line width of the plug 28C is smaller than the diameter or width of the first opening 27. Accordingly, gaps 33 may be formed on both sides of the plug 28C.

A method for forming the high-k metal gate structures HKMG will be described below. The hard mask layer 31, the bit line conductive layer 30 and the barrier layer 29 are etched using the peripheral gate masks 32G as etch masks. Planar gate electrodes 30N and 30P and gate hard masks 31N and 31P may be formed. The planar gate electrodes 30N and 30P are formed by etching of the bit line conductive layer 30. The gate hard masks 31N and 31P are formed by etching of the hard mask layer 31.

The silicon-based capping layer 28B, the work function adjustment layer 25, the rare earth metal-based capping layer 24, the high-k material layer 23 and the interface layer 22 are etched. The high-k metal gate structures HKMG are formed in the first peripheral circuit region 620P and the second peripheral circuit region 620N of the peripheral circuit region 620, respectively. The high-k metal gate structure HKMG of the first peripheral circuit region 620P may include an interface layer pattern 22P, a high-k material layer pattern 23P, a work function adjustment layer pattern 25P, a silicon-based capping layer pattern 28P, a barrier layer pattern 29P, a metal gate electrode 30P, and a hard mask layer pattern 31P. The high-k metal gate structure HKMG of the second peripheral circuit region 620N may include an interface layer pattern 22N, a high-k material layer pattern 23N, a rare earth metal-based capping layer pattern 24N, a work function adjustment layer pattern 25N, a silicon-based capping layer pattern 28N, a barrier layer pattern 29N, a metal gate electrode 30N, and a hard mask layer pattern 31N.

The bit line structure BL and the high-k metal gate structures HKMG may be simultaneously formed through an etching process performed. Therefore the etching process may be simplified.

The bit line structure BL may include the plug 28C, the bit line 30C, and the bit line hard mask 31C. The bit line 30C may extend in the second direction while covering the plug 28C. For example, the bit line 30C extends in a direction crossing with the buried word lines 17. The bit line 30C extends on the first interlayer dielectric layer 21 while having a line shape, and a portion of the bit line 30C is coupled with the plug 28C. The bit line 30C may be electrically coupled with the first impurity region 19 by the plug 28C. While forming the plug 28C, the isolation layer 13 and the sealing layer 18 around the plug 28C may be over-etched. After forming the bit line structure BL and the high-k metal gate structures HKMG, the bit line mask 32C and the peripheral gate masks 32G may be removed.

A process for simultaneously forming the bit line structure BL and the high-k metal gate structures HKMG may be referred to as a GBL process. In the GBL process, to form the bit line structure BL and the high-k metal gate structures HKMG, the process 500 of the third embodiment may be performed. The silicon-based capping layer 28B may be etched by a first sub etching process, and the work function adjustment layer 25 may be etched by a second sub etching process. The rare earth metal-based capping layer 24 may be etched by a third sub etching process, and the high-k material layer 23 may be etched by a high-k material layer etching process.

An etching process for forming the high-k metal gate structures HKMG may be simultaneously applied to the bit line conductive layer 30 and the plug pattern 28A. Accordingly, the plug pattern 28A may be etched by the first sub etching process. After the plug pattern 28A is etched, the plug 28C, and the substrate 11 and the isolation layer 13 under the plug 28C may be protected by spacers 34C. The plug 28C, the substrate 11 and the isolation layer 13 may be continuously exposed to a post-etching process such as the second sub etching process, the third sub etching process and the high-k material layer etching process.

In the present embodiment, before performing the post-etching process, as shown in FIG. 10I, spacers 34C, 34N and 34P may be formed. Accordingly, the excessive recessing of the substrate 11 and the undercutting of the plug 28C may be prevented by the spacers 34C, 34N and 34P. Also, even in the case where the bottom portions of the spacers 34N and 34P are attacked while performing the high-k material layer etching process, since the high-k material layer etching process is performed with a high etch selectivity with respect to the substrate 11 and the isolation layer 13, the excessive recessing of the substrate 11 and the undercutting of the plug 28C may be prevented.

Figure 11:
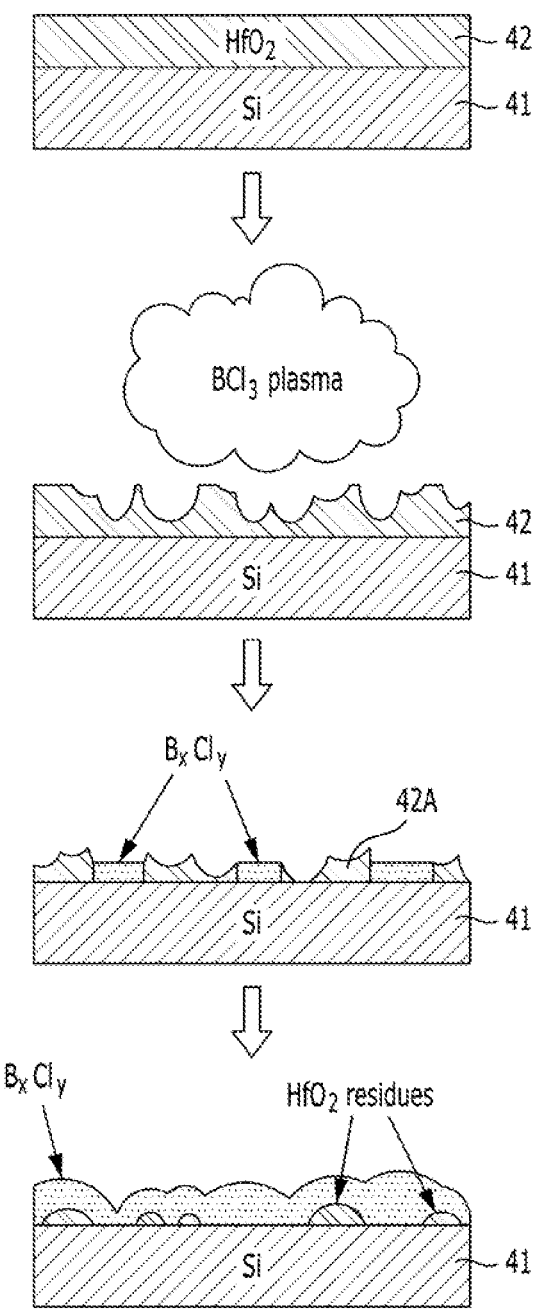
FIG. 11 is a diagram describing an etch mechanism of hafnium oxide according to an embodiment.

FIG. 11 is a diagram describing an etch mechanism of hafnium oxide according to the embodiments. Referring to FIG. 11, hafnium oxide ($HfO_2$) 42 is formed on a silicon substrate (Si) 41. The hafnium oxide 42 may be etched by applying only $BCl_3$ plasma. By $BCl_3$ plasma, in the hafnium oxide 42, bonding breakage, adsorption and etching may sequentially occur. For example, $HfO_2$ may be divided into Hf and O by bonding breakage. In adsorption, Hf may be adsorbed to HfCl, and $B_xCl_y$ may be adsorbed to $BCl_xO$. In etching, HfCl may be desorbed to HfCl, and $BCl_xO$ may be desorbed to BOCl. In an etching process for the hafnium oxide 42, it is important to carry out desorption by forming a BOCl gas as volatile etching residues.

However, during this process, an undesorbed $B_xCl_y$ gas forms nonvolatile Si—B bonds on the surface of the silicon substrate 41. As the undesorbed $B_xCl_y$ gas is re-deposited on an unetched hafnium oxide 42A, hafnium oxide ($HfO_2$) residues are produced. In the present embodiments, since an etching process is performed using a gas mixture of a $BCl_3$ gas and an Ar gas, it is possible to etch hafnium oxide without residues.

Figure 12:
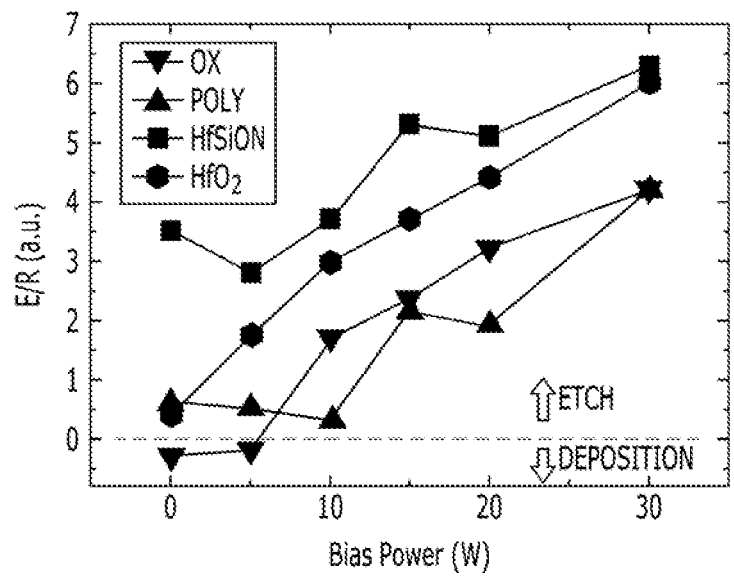
FIG. 12 is a graph describing a difference in etch rate between a high-k material layer and other materials according to a bias power.

FIG. 12 is a graph describing etch rates of a high-k material layer and other materials according to a bias power. The results of FIG. 12 represent the case of applying a gas mixture of $BCl_3$ and Ar to various materials. In FIG. 12, the graph "OX" may denote silicon oxide, and the graph "POLY" may denote polysilicon or a substrate. The graphs "HfSiON" and "$HfO_2$" may denote hafnium oxides.

Referring to FIG. 12, if bias power smaller than 15 W is applied, the etch rate of a substrate is remarkably low. Accordingly, excessive substrate recessing may be prevented. However, since the tendency of deposition is substantial compared with etching, etching residues of a high-k material may be produced. The tendency of deposition may refer to re-deposition by $B_xCl_y$ gas.

If bias power larger than 25 W is applied, etching residues may be suppressed, but substrate recessing may excessively occur. See the etch rate of the graph "POLY". The "POLY" has a low etch rate at bias power smaller than 15 W and a high etch rate at bias power equal to or larger than 15 W. As a result, an etching process for a high-k material layer may use bias power in the range of 15 W to 25 W to prevent production of etching residues and excessive substrate recessing.

Figure 13:
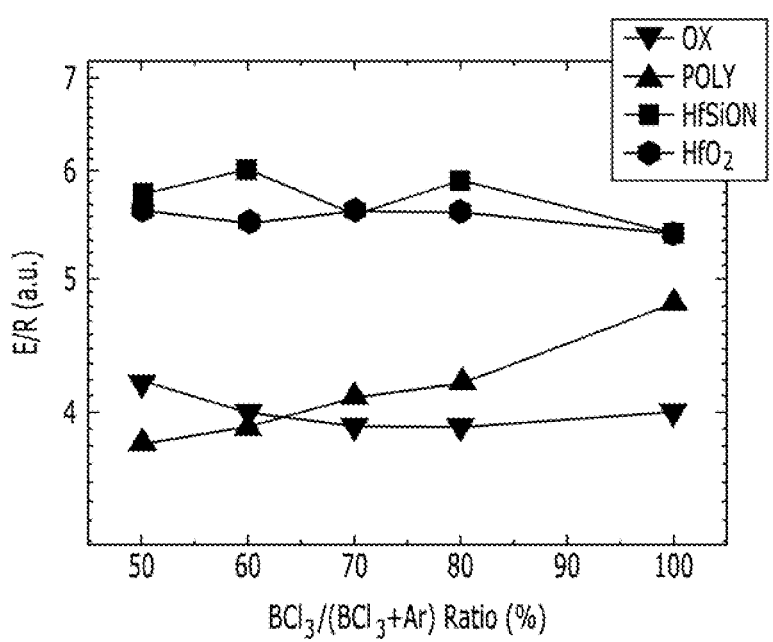
FIG. 13 is a graph describing a difference in etch rate between a high-k material layer and other materials according to a fraction of $BCl_3$ with respect to a mixture gas of $BCl_3$ and Ar.

FIG. 13 is a graph describing etch rates of a high-k material layer and other materials according to a fraction of a main gas, e.g., $BCl_3$, included in a plasma gas mixture, e.g., a mixture of $BCl_3$ and Ar. Here, Ar serves as an additive gas of the plasma gas.

A fraction of $BCl_3$ in a gas mixture of $BCl_3$ and Ar may be calculated by the following Equation 1.

$$\frac{BCl_3}{BCl_3 + Ar} \qquad [\text{Equation 1}]$$

In Equation 1, a fraction of $BCl_3$ may increase or decrease according to an amount of Ar. For example, if an amount of Ar (the additive gas) is increased, a fraction of $BCl_3$ (the main gas) decreases. Conversely, if an amount of Ar is decreased, a fraction of $BCl_3$ increases.

As a fraction of $BCl_3$ increases, excessive substrate recessing increasingly occurs. That is, if an amount of Ar is decreased, the etch rate of the substrate increases (see the graph "POLY").

As a fraction of $BCl_3$ decreases, excessive substrate recessing is suppressed. Namely, if an amount of Ar is increased, the etch rate of the substrate decreases. Therefore, the additive gas, for example, Ar, needs to be maintained at the same amount as the main gas, for example, $BCl_3$. Under this condition, an etch selectivity of high-k material with respect to a substrate may be 14 or over. An etch rate of the high-k material layer shows not much difference between 50%-100%. See FIG. 13.

As is apparent from the above descriptions, according to an embodiment, since a plasma etching against a high-k material layer is performed using the plasma including a main etching gas and an additive gas in the same amount to each other, an etch selectivity with respect to a substrate may increase and excessive recessing of the substrate may be prevented. Also, according to an embodiment, it is possible to simultaneously etch stacks positioned in different regions, without causing etching defects.

What is claimed is:

1. A method for forming a gate, the method comprising:
   forming a high-k material layer over a substrate;
   forming an overlying layer over the high-k material layer;
   performing a first etching process for etching the overlying layer to form an overlying layer pattern;
   forming a spacer on a sidewall of the overlying layer pattern; and
   performing a second etching process using plasma including a etch gas and an additive gas, to etch the high-k material layer,
   wherein an amount of the additive gas is substantially the same as the main etch gas to increase an etch selectivity with respect to the substrate,
   wherein the second etching process is performed at a temperature higher than the first etching process.

2. The method according to claim 1, wherein the main etch gas includes $BCl_3$.

3. The method according to claim 1, wherein the additive gas includes argon.

4. The method according to claim 1, wherein the high-k material layer includes a hafnium-containing layer.

5. The method according to claim 1, wherein the first etching process and the second etching process are performed in inductively coupled plasma equipment.

6. The method according to claim 1, wherein the second etching process is performed by applying bias power larger than 10 W.

7. The method according to claim 1, further comprising:
   performing hydrogen fluoride (HF)-based wet cleaning after the second etching process.

8. The method according to claim 1, wherein the first etching process is performed at 50 degrees Celsius, and
wherein the second etching process is performed at 220 degrees Celsius.

9. The method according to claim 1, wherein the overlying layer includes a work function adjustment layer, a silicon-based capping layer over the work function adjustment layer, and a metal gate electrode layer over the silicon-based capping layer.

10. The method according to claim 9, wherein the first etching process includes:
a first sub etching process for etching the silicon-based capping layer; and
a second sub etching process for etching the work function adjustment layer.

11. The method according to claim 10,
wherein the first sub etching process includes a main etching process and an over etching process, and
wherein the over etching process is performed using an etchant which has a selectivity equal to or higher than 10 with respect to the work function adjustment layer.

12. The method according to claim 11, wherein the over etching process is performed using plasma including a bromine-containing gas and an oxygen-containing gas.

13. The method according to claim 10, wherein the second sub etching process is performed using plasma including a chlorine-containing gas and argon gas.

14. The method according to claim 1, wherein the overlying layer includes a rare earth metal-based capping layer, a work function adjustment layer over the rare earth metal-based capping layer, a silicon-based capping layer over the work function adjustment layer, and a metal gate electrode layer over the silicon-based capping layer.

15. The method according to claim 14, wherein the first etching process includes:
a first sub etching process for etching the silicon-based capping layer;
a second sub etching process for etching the work function adjustment layer; and
a third sub etching process for etching the rare earth metal-based capping layer.

16. The method according to claim 15,
wherein the first sub etching process includes (i) a main etching process which is performed until the work function adjustment layer is exposed and (ii) an over etching process which is performed after the work function adjustment layer is exposed, and
wherein the over etching process is performed using plasma which has a selectivity equal to or higher than 10 with respect to the work function adjustment layer.

17. The method according to claim 16, wherein the over etching process is performed using plasma including a bromine-containing gas and oxygen gas.

18. The method according to claim 15, wherein the second sub etching process is performed using plasma including a chlorine-containing gas and argon gas.

19. The method according to claim 15, wherein the third sub etching process is performed using plasma including HCl.

* * * * *